US012621925B2

(12) United States Patent
Park

(10) Patent No.: US 12,621,925 B2
(45) Date of Patent: May 5, 2026

(54) CIRCUIT BOARD HAVING ELECTROMAGNETIC SHIELDING STRUCTURES AND ELECTRONIC DEVICE INCLUDING THE SAME

(71) Applicant: SAMSUNG ELECTRONICS CO., LTD., Suwon-si (KR)

(72) Inventor: Cheuk Park, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 324 days.

(21) Appl. No.: 18/164,788

(22) Filed: Feb. 6, 2023

(65) Prior Publication Data

US 2023/0189430 A1      Jun. 15, 2023

Related U.S. Application Data

(63) Continuation of application No. PCT/KR2021/010197, filed on Aug. 4, 2021.

(30) Foreign Application Priority Data

Aug. 4, 2020     (KR) ......................... 10-2020-0097370

(51) Int. Cl.
  *H05K 1/02*         (2006.01)
  *H05K 1/11*         (2006.01)
      (Continued)

(52) U.S. Cl.
  CPC ......... *H05K 1/0219* (2013.01); *H05K 1/0298* (2013.01); *H05K 1/115* (2013.01); *H05K 1/189* (2013.01)

(58) Field of Classification Search
  None
  See application file for complete search history.

(56) References Cited

U.S. PATENT DOCUMENTS 3,398,232 A  *   8/1968  Norman ................... H05K 7/18
                                                            439/43
7,458,833 B2 *  12/2008  Ha ......................... H05K 1/189
                                                            439/165
(Continued)

FOREIGN PATENT DOCUMENTS

JP          2003017817 A      1/2003
JP          2016142801 A      8/2016
        (Continued)

OTHER PUBLICATIONS

Original and Translation of EP3280005 (Year: 2018).*

(Continued)

*Primary Examiner* — Timothy J. Dole
*Assistant Examiner* — Muhammed Azam
(74) *Attorney, Agent, or Firm* — CANTOR COLBURN LLP

(57) ABSTRACT

A circuit board electrically connected to an electronic device includes a base layer, a first conductive layer on a first surface of the base layer, a second conductive layer on a second surface of the base layer and including a terminal portion which is exposed outside of the circuit board and at which the circuit board is electrically connected to the electronic device, a first electromagnetic shield layer which faces the base layer with the first conductive layer therebetween and overlaps the terminal portion of the second conductive layer and a second electromagnetic shield layer which faces the base layer with the second conductive layer therebetween, and is spaced apart from the terminal portion of the second conductive layer in a direction along the base layer.

19 Claims, 12 Drawing Sheets

(51) Int. Cl.
  *H05K 1/18*   (2006.01)
  *H05K 1/189*   (2026.01)

(56) References Cited

U.S. PATENT DOCUMENTS

| | | | | |
|---|---|---|---|---|
| 8,168,893 | B2 * | 5/2012 | Ito | H01L 24/19 |
| | | | | 361/818 |
| 8,798,694 | B2 * | 8/2014 | Morishita | H01Q 7/00 |
| | | | | 455/77 |
| 9,837,361 | B2 * | 12/2017 | Seo | H01L 23/552 |
| 9,854,678 | B2 * | 12/2017 | Song | H01R 13/6594 |
| 9,913,412 | B2 * | 3/2018 | Chen | H05K 9/0039 |
| 9,980,376 | B1 | 5/2018 | Kim et al. | |
| 10,117,328 | B1 | 10/2018 | Zhong et al. | |
| 10,431,887 | B2 * | 10/2019 | Kim | H01Q 1/2283 |
| 10,477,082 | B2 * | 11/2019 | Jung | H04N 23/51 |
| 10,477,675 | B1 * | 11/2019 | Kim | H05K 1/0219 |
| 10,566,293 | B2 * | 2/2020 | Kuk | H05K 1/0218 |
| 10,601,113 | B2 * | 3/2020 | Bae | H01Q 1/526 |
| 10,674,607 | B2 * | 6/2020 | Park | H05K 1/116 |
| 10,684,650 | B2 * | 6/2020 | Sim | G06F 1/1684 |
| 10,736,211 | B2 * | 8/2020 | Park | G06F 1/1683 |
| 10,790,239 | B2 * | 9/2020 | Lim | H01L 24/19 |
| 11,178,778 | B2 * | 11/2021 | Nomura | H01L 23/28 |
| 11,202,364 | B2 * | 12/2021 | Hong | H05K 1/118 |
| 11,363,712 | B2 * | 6/2022 | Kim | H05K 5/0017 |
| 11,404,764 | B2 * | 8/2022 | Choi | H01Q 1/38 |
| 11,431,083 | B2 * | 8/2022 | Kim | H04B 1/3888 |
| 11,462,846 | B2 * | 10/2022 | Seo | H01Q 21/065 |
| 11,546,454 | B2 * | 1/2023 | Hong | H05K 1/144 |
| 11,553,629 | B2 * | 1/2023 | Lee | H05K 9/0083 |
| 11,570,895 | B2 * | 1/2023 | Ju | H05K 1/0201 |
| 11,670,963 | B2 * | 6/2023 | Yun | H02J 50/80 |
| | | | | 320/108 |
| 11,881,647 | B2 * | 1/2024 | Ghim | H04M 1/0274 |
| 11,895,253 | B2 * | 2/2024 | Seo | H04M 1/0218 |
| 11,943,888 | B2 * | 3/2024 | Hong | H05K 1/09 |
| 12,041,717 | B2 * | 7/2024 | Yang | H05K 1/0266 |
| 12,058,830 | B2 * | 8/2024 | Cho | H04M 1/0214 |
| 2007/0102830 | A1 | 5/2007 | Muto et al. | |
| 2012/0039050 | A1 * | 2/2012 | Chang | H01Q 1/405 |
| | | | | 333/236 |
| 2012/0247811 | A1 | 10/2012 | Lin et al. | |
| 2013/0154773 | A1 * | 6/2013 | Siprak | H01P 3/006 |
| | | | | 333/238 |
| 2014/0053004 | A1 | 2/2014 | Chang et al. | |

| | | | | |
|---|---|---|---|---|
| 2016/0093939 | A1 * | 3/2016 | Kim | H01Q 1/243 |
| | | | | 343/720 |
| 2017/0060188 | A1 * | 3/2017 | Han | G06F 1/1641 |
| 2017/0229818 | A1 | 8/2017 | Robinson et al. | |
| 2018/0017999 | A1 * | 1/2018 | Kim | G06F 1/1601 |
| 2018/0034211 | A1 | 2/2018 | Little et al. | |
| 2020/0045826 | A1 * | 2/2020 | Wang | H10K 50/87 |
| 2020/0093012 | A1 * | 3/2020 | Woo | H05K 3/365 |
| 2020/0267839 | A1 * | 8/2020 | Woo | G06F 1/1681 |
| 2020/0363892 | A1 * | 11/2020 | Kim | G06F 3/0354 |
| 2021/0274645 | A1 * | 9/2021 | Hong | H05K 1/0219 |
| 2021/0274647 | A1 | 9/2021 | Tenno et al. | |
| 2022/0149669 | A1 * | 5/2022 | Kim | H02J 7/02 |
| 2022/0279685 | A1 * | 9/2022 | Cheon | H05K 9/0081 |
| 2022/0376386 | A1 * | 11/2022 | Lee | H05K 1/144 |
| 2023/0009036 | A1 * | 1/2023 | Hong | H05K 1/115 |
| 2023/0189430 | A1 * | 6/2023 | Park | H05K 1/0219 |
| | | | | 174/250 |
| 2023/0199093 | A1 * | 6/2023 | Kang | H04M 1/0249 |
| | | | | 455/566 |
| 2023/0266798 | A1 * | 8/2023 | Jung | H05K 1/147 |
| | | | | 361/807 |
| 2023/0369746 | A1 * | 11/2023 | Son | H04B 1/006 |
| 2024/0224410 | A1 * | 7/2024 | Lee | H05K 1/0218 |
| 2024/0250412 | A1 * | 7/2024 | Seo | H01Q 13/10 |

FOREIGN PATENT DOCUMENTS

| | | | |
|---|---|---|---|
| JP | 2017534141 | A | 11/2017 |
| JP | 201857726 | A | 4/2018 |
| JP | 2019114474 | A | 7/2019 |
| KR | 1020050064549 | A | 6/2005 |
| KR | 1020060018545 | A | 3/2006 |
| KR | 100770832 | B1 | 10/2007 |
| KR | 1020080012527 | A | 2/2008 |
| KR | 101234987 | | 2/2013 |
| KR | 1020200005950 | A | 1/2020 |
| WO | 2020130004 | A1 | 6/2020 |

OTHER PUBLICATIONS

WO_2020_130004_translation (Year: 2020).*
KR_10_2020_0005950_translation (Year: 2020).*
Original and Translation of KR20210040699 (Year: 2021).*
Korean Office Action for Korean Patent Application No. 10-2020-0097370 dated Jan. 21, 2025.

* cited by examiner

100

CIRCUIT BOARD HAVING ELECTROMAGNETIC SHIELDING STRUCTURES AND ELECTRONIC DEVICE INCLUDING THE SAME

CROSS-REFERENCE TO RELATED APPLICATIONS

This application is a continuation application of International Application No. PCT/KR2021/010197 designating the United States, filed on Aug. 4, 2021, at the Korean Intellectual Property Receiving Office and claiming priority to Korean Patent Application No. 10-2020-0097370 filed on Aug. 4, 2020, at the Korean Intellectual Property Office, the disclosures of which are incorporated by reference herein in their entireties.

BACKGROUND

Field

Due to the development of communication technology, various services using communication technology are being created. Some services may require very high throughput data communication. Accordingly, technologies for transmitting large amounts of data in various environments are being applied.

A multiple input multiple output (MIMO) communication system may include a plurality of transmit antennas of a transmitting device (e.g., a base station) and a plurality of receiving antennas of a receiving device (e.g., a user terminal), and may improve throughput by simultaneously transmitting a plurality of streams by using the plurality of antennas. In addition, a mobile communication terminal may be connected to an external electronic device by wire (e.g., USB type C) and may process data at high speed.

Description of the Related Art

In a user terminal, at least one printed circuit board may be disposed on each of the upper and lower stages therein. An RF transceiver (radio-frequency transceiver) for processing wireless communication signals transmitted/received to/from a plurality of antennas located in the upper and lower stages therein may be disposed on a first printed circuit board on the upper stage in the terminal. Wireless communication signals transmitted to/received from the antennas in the lower stage of the terminal may be provided to an RF transceiver via a circuit board such as a flexible printed circuit board (FPCB) connecting the second printed circuit board in the lower stage of the terminal to the first printed circuit board. In addition, the processor of the terminal may be disposed on the first printed circuit board in the upper stage of the terminal. When the processor of the terminal located in the lower stage of the terminal transmits/receives data signals to/from the interface of the second printed circuit board located in the lower stage of the terminal, the flexible printed circuit board (FPCB) interconnecting the second printed circuit board and the first printed circuit board may be used. When the processor of the terminal located in the lower stage of the terminal transmits/receives data signals to/from an external device connected to the interface of the second printed circuit board located in the lower stage of the terminal, the flexible printed circuit board (FPCB) interconnecting the second printed circuit board and the first printed circuit board may be used.

SUMMARY

Technical Problem

Mobile terminals often use higher-speed signals than conventional terminals in order to have high performance and fast network access performance. In addition, in order to ensure assembly flexibility, an FPCB may be designed to allow high-speed signals to flow therethrough, and for this reason, noise induced in high-speed signals through the FPCB often causes deterioration in radiation performance.

A circuit board such as a FPCB or a flexible printed circuit (FPC) may be connected to a connector (e.g., a ZIF connector or a board-to-board connector) that enables connection with another component in an electronic device. The connector serves to connect two conductors in a circuit. In order to reduce signal noise generated in or affecting an FPCB, an electromagnetic interference (EMI) shield layer may be provided in a partial area of the FPCB. However, it is difficult to provide an EMI shield layer up to a portion connected to a connector of an FPCB for connection to a printed circuit board (PCB). In order to solve this, conventionally, there was a method of separately using insulating and laminated tapes for shielding. When a separate laminated tape is used instead of an EMI tape, shielding is possible, but a difference in performance may occur depending on a tape attachment deviation, and there is a problem in that the shielding performance of the laminated tape is not as good as that of the EMI tape.

An embodiment according to the disclosure relates to a design of an FPCB pattern for applying an EMI shield layer up to an end of an FPCB to reduce noise induced in an FPCB that is designed to allow high-speed signals to flow therethrough.

Based on the discussion, the disclosure discloses a structure of a circuit board such as a flexible printed circuit board (FPCB) configured to block noise induced in a high-speed signal designed in the FPCB.

The disclosure also discloses a structure of an FPCB configured to block noise induced in a connector connecting portion.

The disclosure also discloses a structure of an FPCB configured to prevent a short (e.g., an electrical short) between layers disposed or provided in the FPCB.

Furthermore, the disclosure discloses a structure of an FPCB for electrical connection between a first conductive layer and a second conductive layer included in the FPCB.

Solution to Problem

A circuit board such as a flexible printed circuit board (FPCB) included in an electronic device according to an embodiment of the present disclosure may include a base, a first conductive layer located in a first direction of the base, a second conductive layer located in a second direction of the base, a terminal portion located on one side surface of the second conductive layer and exposed to the outside to be electrically connected to an external terminal in the second direction, a first shield layer disposed in the first direction of the first conductive layer and disposed to at least partially overlap the terminal portion, and a second shield layer disposed in the second direction of the second conductive layer and disposed to be spaced apart from the terminal portion so as not to overlap the terminal portion.

A flexible printed circuit (FPC) according to various embodiments of the disclosure may include a first conductive layer, a base disposed over the first conductive layer, and a second conductive layer disposed over the base. The first conductive layer may have a first area in which a wiring is removed from an edge of the FPC, the second conductive layer may have a wiring disposed up to the edge of the FPC, and a first wiring included in the first conductive layer may be exposed to be electrically connected to a connector in a second area spaced farther apart from the edge than the first area.

An electronic device according to various embodiments may include a housing, a printed circuit board disposed within the housing, a connector disposed on the printed circuit board, and a flexible printed circuit (FPC) having one end connected to the connector. The connection FPC may include a first conductive layer, a base disposed over the first conductive layer, and a second conductive layer disposed over the base. The first conductive layer may have a first area in which a wiring is removed from an edge of the FPC, the second conductive layer may have a wiring disposed up to the edge of the FRC, and a first wiring included in the first conductive layer may be exposed to be electrically coupled with a connector in a second area spaced farther apart from the edge than the first area.

Advantageous Effects of Invention

A flexible printed circuit board (FPCB) included in an electronic device according to an embodiment may have an effect of shielding EMI due to signal noise induced in a connector connecting portion.

An FPCB included in an electronic device according to an embodiment provides an effect capable of preventing an electrical short between layers included in the FPCB.

Advantageous effects obtainable from the disclosure may not be limited to the above mentioned effects, and other effects which are not mentioned may be clearly understood, through the following descriptions, by those skilled in the art to which the disclosure pertains.

DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
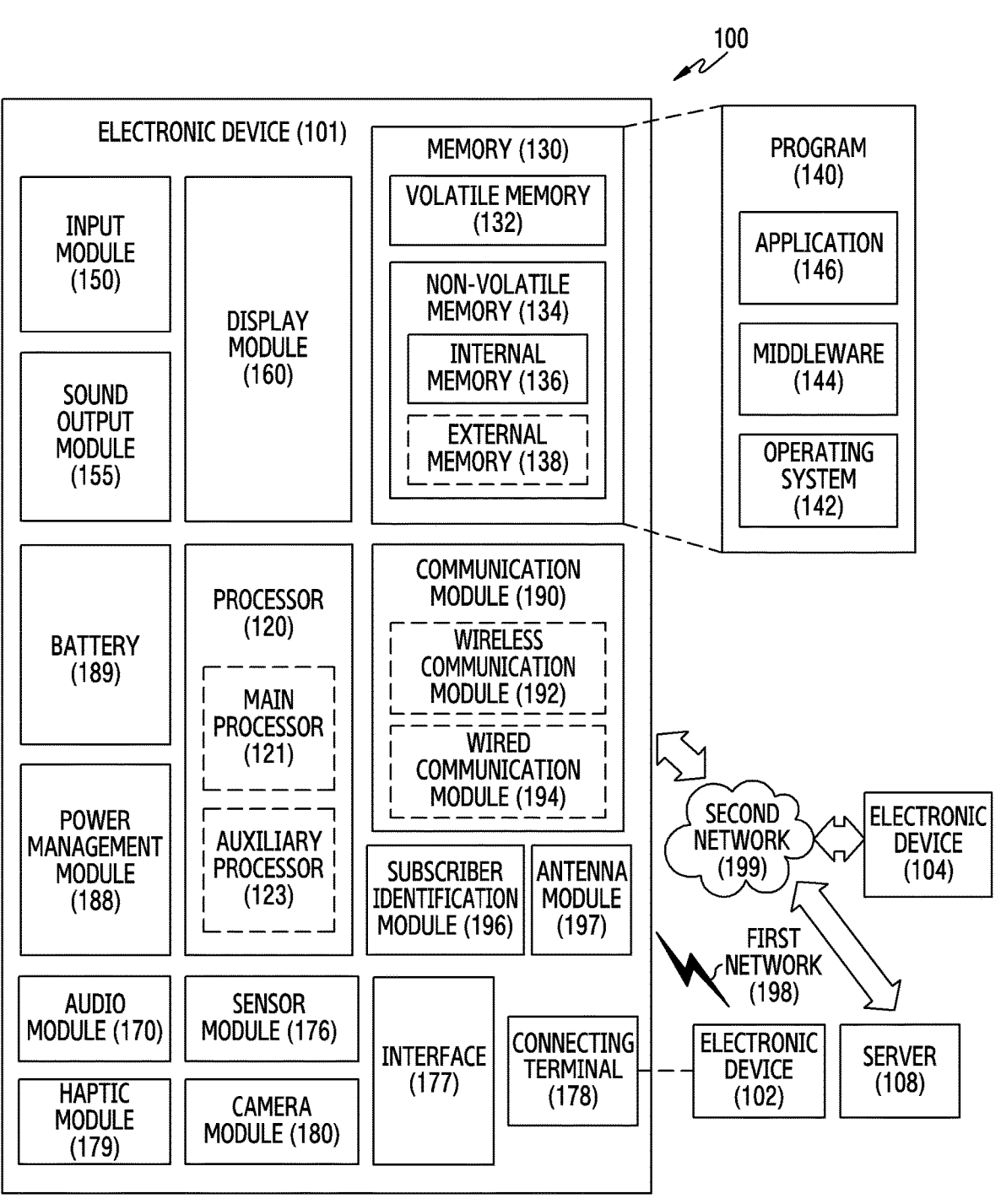
FIG. 1 a block diagram of an electronic device in a network environment according to an embodiment.

The terms used in the disclosure are only used to describe specific embodiments, and are not intended to limit the disclosure. A singular expression may include a plural expression unless they are definitely different in a context.

Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software, and thus the various embodiments of the disclosure may not exclude the perspective of software.

In the following description, terms referring to control information (e.g., information, value, and command), terms for operation states (e.g., step, operation, and procedure), terms referring to signals (e.g., signal, sequence, symbol, and information), terms referring to data, terms referring to network entities (e.g., base station, digital unit (DU), radio unit (RU), element management system (EMS), access unit (AU), centralized unit (CU), LTE management server (LMS), and management device), terms referring to messages (e.g., signal, command, data, triggering, and notification), terms referring to device elements, and the like are illustratively used for the convenience of description. Therefore, the disclosure is not limited by the terms as used below, and other terms referring to subjects having equivalent technical meanings may be used.

As used in the disclosure, the expression "greater than" or "less than" is used to determine whether a specific condition is satisfied or fulfilled, but this is intended only to illustrate an example and does not exclude "greater than or equal to" or "equal to or less than". A condition indicated by the expression "greater than or equal to" may be replaced with a condition indicated by "greater than", a condition indicated by the expression "equal to or less than" may be replaced with a condition indicated by "less than", and a condition indicated by "greater than and equal to or less than" may be replaced with a condition indicated by "greater than and less than".

Furthermore, in the disclosure, various embodiments will be described using terms employed in some communication standards (e.g., 3rd generation partnership project (3GPP)), but they are only for the sake of illustration. The embodiments of the disclosure may also be easily applied to other communication systems through modifications.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input (module) device 150, a sound output (module) device 155, a display (module) device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements.

The terminology used herein is for the purpose of describing particular embodiments only and is not intended to be limiting. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof As used herein, such terms as "1st" and "2nd," or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element. It will be understood that when an element is referred to as being related to another element such as being "on," "connected to," "coupled to" and the like, relative to another element, the elements can be directly on, connected to or coupled to each other or intervening elements may be present therebetween. In contrast, when an element is referred to as being related to another element such as being "directly on," "directly connected to," "directly coupled to" and the like, relative to another element, no intervening element is present therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor(e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
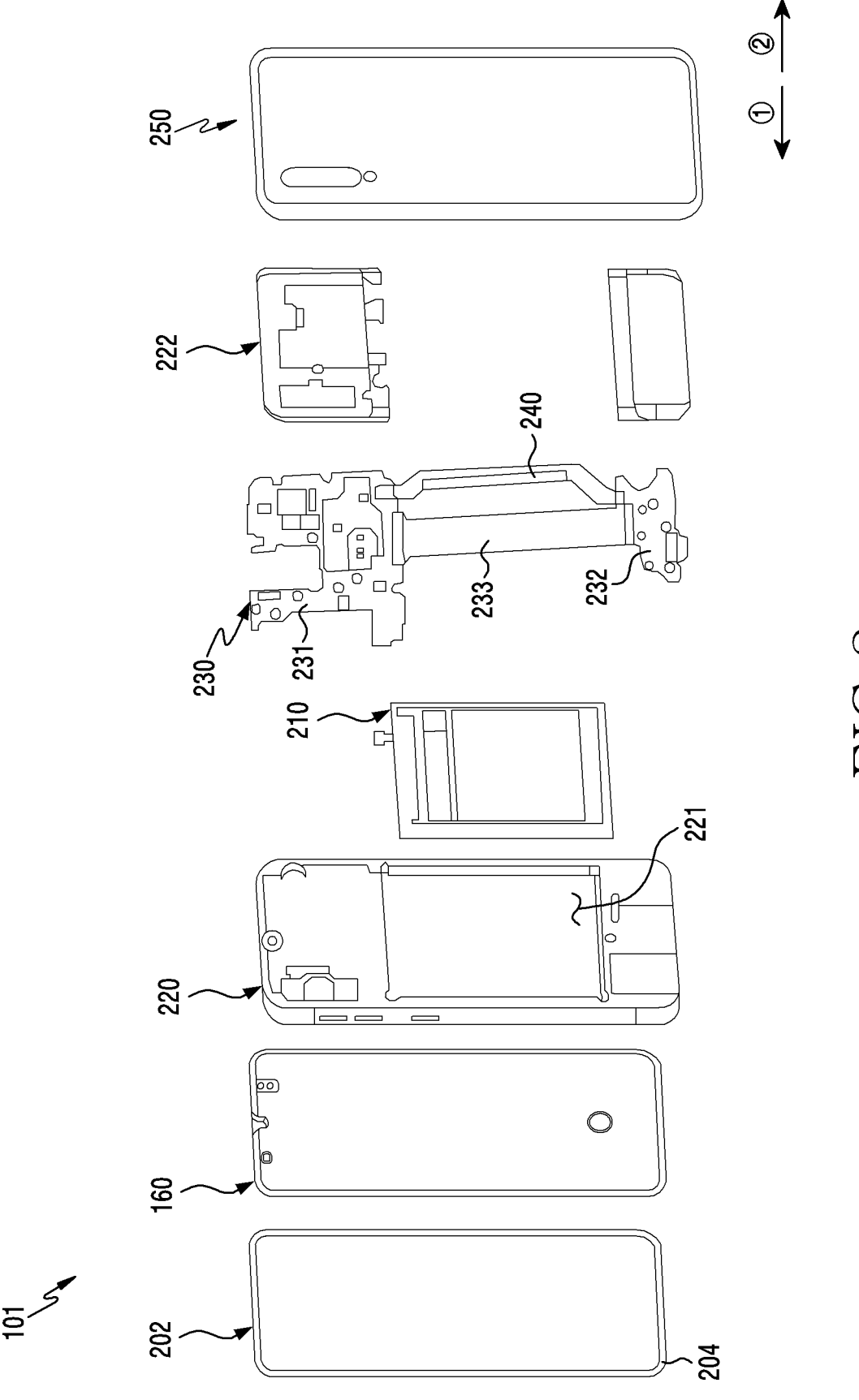
FIG. 2 is an exploded perspective view of the electronic device according to an embodiment.

FIG. 2 is an exploded perspective view of an electronic device 101 according to an embodiment.

Referring to FIG. 2, the electronic device 101 may include a window 202, a display device 160 (or display module), a first bracket 220, a battery 210, a circuit board such as a printed circuit board 230, a second bracket 222, and a housing cover 250.

In an embodiment, the window 202 maybe disposed over the display device 160 (e.g., in direction ①, a front direction or image display direction. The window 202 may further include a light blocking area such as including a light blocking film 204 configured to cover a portion of the first bracket 220 and a non-display area of the display device 160 that may be visible through the substantially transparent window 202.

In an embodiment, the display device 160 may be disposed between the window 202 and the first bracket 220. The display device 160 may be electrically connected to the printed circuit board 230 by a circuit board such as a flexible printed circuit board (not illustrated).

In an embodiment, the first bracket 220 may be disposed between the display device 160 and the printed circuit board 230. The first bracket 220 may support components of the electronic device 101 or provide a space capable of accommodating components of the electronic device 101. For example, the first bracket 220 may be disposed below the display device 160 (e.g., in direction ②) and support the display device 160. As another example, the first bracket 220 may provide a seating space 221 capable of accommodating the battery 210.

In an embodiment, at least a portion of the first bracket 220 may be configured as an antenna radiator that transmits/receives wireless communication signals. At least a portion of the first bracket 220 used as the antenna radiator may include a metal material. At least a portion of an area where the first bracket 220 is used the an antenna radiator may be exposed to the outside (e.g., to outside the electronic device 101). In an embodiment, the first bracket 220 may be configured integrally with an outer housing of at least a partial area. The at least partial area of the first bracket 220 may be configured to be exposed to the outside. At least a portion of the first bracket 220 may be made of or include metal and used as a radiator like the antenna radiator. The first bracket 220 may be referred to as a "first support member," a "first support plate," a "first bezel member," a "first housing," or another term.

In an embodiment, at least a portion of the battery 210 may be accommodated and disposed in the seating space 221 of the first bracket 220. The battery 210 may store power required for the electronic device 101. The battery 210 may include, for example, a rechargeable secondary battery. The battery 210 may be integrally disposed inside the electronic device 101, or may be detachably disposed on the electronic device 101.

In an embodiment, the printed circuit board 230 may be disposed between the first bracket 220 and the second bracket 222, or between the first bracket 220 (or the second bracket 222) and the housing cover 250. In an embodiment, the printed circuit board 230 may include a plurality of circuit boards such as a first printed circuit board 231 (e.g., a main printed circuit board), a second printed circuit board 232 (e.g., a sub-printed circuit board), a first flexible printed circuit board (FPCB) 233, and a second FPCB 240. The first printed circuit board 231 and the second printed circuit board 232 may be supported by the first bracket 220 and/or the second bracket 222. In an embodiment, the first printed circuit board 231 and the second printed circuit board 232 may be seated and supported not only on the first bracket 220 and/or the second bracket 222, but also on a component (e.g., a speaker or an antenna) provided inside of the electronic device 101.

In an embodiment, a processor, memory, and an interface may be mounted on the first printed circuit board 231 or the second printed circuit board 232. The processor may include one or more of, for example, a central processing unit, an application processor, a graphics processor, an image signal processor, a sensor hub processor, or a communication processor. The memory may include, for example, volatile memory or non-volatile memory. The interface may include, for example, at least one of a high-definition multimedia interface (HDMI), a universal serial bus (USB) interface, an SD card interface, and/or an audio interface. For example, the interface may electrically or physically connect the electronic device 101 to an external electronic device, and may include a USB connector, an SD card/MMC connector, or an audio connector.

In an embodiment, the first printed circuit board 231 and the second printed circuit board 232 may provide electrical connection paths between various components of the electronic device 101. For example, an antenna (not illustrated), an interface 177 (e.g., a USB), a camera module 112, a battery 210, a display device 160, and the processor may be directly or indirectly electrically connected to the first printed circuit board 231 or the second printed circuit board 232. The processor may be operatively coupled to various components in the electronic device via electrical connection paths provided by the first printed circuit board 231 and the second printed circuit board 232.

In an embodiment, the first printed circuit board 231 and the second printed circuit board 232 may be electrically connected to each other, by the first FPCB 233. The first FPCB 233 may be implemented in the form of a flexible circuit board at least partially formed of (or including) a flexible material.

In an embodiment, the second FPCB 240 may be coupled to the first printed circuit board 231 and to the second printed circuit board 232. The second FPCB 240 may include a plurality of transmission lines configured to transmit/receive wireless communication signals. The second FPCB 240 may be referred to as an FPCB radio-frequency cable (FRC) 240 in that it includes a transmission line to transmit/receive wireless communication signals.

In an embodiment, the second bracket 222 may be disposed between the first printed circuit board 231 and the housing cover 250. The second bracket 222 may be accommodated in a space defined by the housing cover 250. The second bracket 222 may include metal and/or non-metal (e.g., polymer).

In an embodiment, the housing cover 250 may be disposed below the second bracket 222 (e.g., in direction ②). In an embodiment, the housing cover 250 may be physically coupled to the first bracket 220 and/or the second bracket 222. For example, the housing cover 250 may be coupled to the first bracket 220 and/or the second bracket 222 by at least one coupling member (e.g., a screw) (not illustrated). As another example, the housing cover 250 may be coupled to the first bracket 220 and/or the second bracket 222 by an adhesive member (e.g., adhesive tape or adhesive liquid) (not illustrated). In another embodiment, at least two of the housing cover 250, the first bracket 220, and/or the second bracket 222 may be integrally configured, such as to define a single body. The housing cover 250 may be referred to as a "rear plate" or another term.

The FPCB illustrated in the following description may be referred to as a "flexible printed circuit radio-frequency cable (FRC)." In order for the plurality of components of the electronic device 101 according to various embodiments of the disclosure to operate, at least one circuit board such as a printed circuit board (PCB) may be present. In addition, components within the electronic device 101 may be electrically connected to a printed circuit board (PCB). Specifically, the electrical connection may be implemented by using a flexible circuit board (FPCB) and a connector.

In an embodiment, the components may be electrically connected to connector connecting portions (e.g., pads or connectors) disposed on the FPCB, by using connectors disposed on the PCB. In an embodiment, the battery (e.g., 189 in FIG. 1) may be electrically connected to the printed circuit board by using a connector disposed at an end of the FPCB. In an embodiment, the camera module (e.g., 180 in FIG. 1) may be electrically connected to the printed circuit board by using a connector disposed at an end of the flexible circuit board. In an embodiment, a plurality of printed circuit boards (PCBs) may be provided, and the plurality of printed circuit boards may be connected to each other by using an FPCB. A connector may be considered as a part of a circuit board, without being limited thereto.

An FPCB according to various embodiments of the disclosure may include a plurality of layers. The plurality of layers may include at least one conductive layer and at least one non-conductive layer, and the at least one conductive layer and the at least one non-conductive layer may be stacked on each other. Where there is more than one of a conductive layer or a non-conductive layer, the layers may be alternately stacked.

In an embodiment, a plurality of wirings may be provided, such as by patterning the conductive layer of the FPCB to define a conductive wiring layer. The plurality of wirings may include a transmission line for signals output from a low-noise amplifier front end module (LFEM). A plurality of transmission lines may be implemented.

In an embodiment, a transmission line provided on the FPCB may be shielded (e.g., electrically shielded), such as by being surrounded by a ground layer (or a ground line) to provide electrical grounding, secure isolation from other transmission lines and to reduce influence and transmission loss from ambient noise (e.g., electrical noise). In an embodiment, even when a plurality of transmission lines are implemented, each of the transmission lines may be shielded in the form of being surrounded by the (electrical) ground layer.

In an embodiment, the FPCB (FRC) may include a portion formed of a flexible material that is bendable. The flexible portion may include multiple portions connected to each other to form one portion, or may be separated from each other in the FPCB (FRC). In an embodiment, since the shielding environments of the transmission line in the flexible portion and the rigid portion of the FRC are different areas of the FPCB, the thicknesses and/or widths of the transmission line may be different in the flexible portion and the rigid portion.

Figures 3A, 3B:
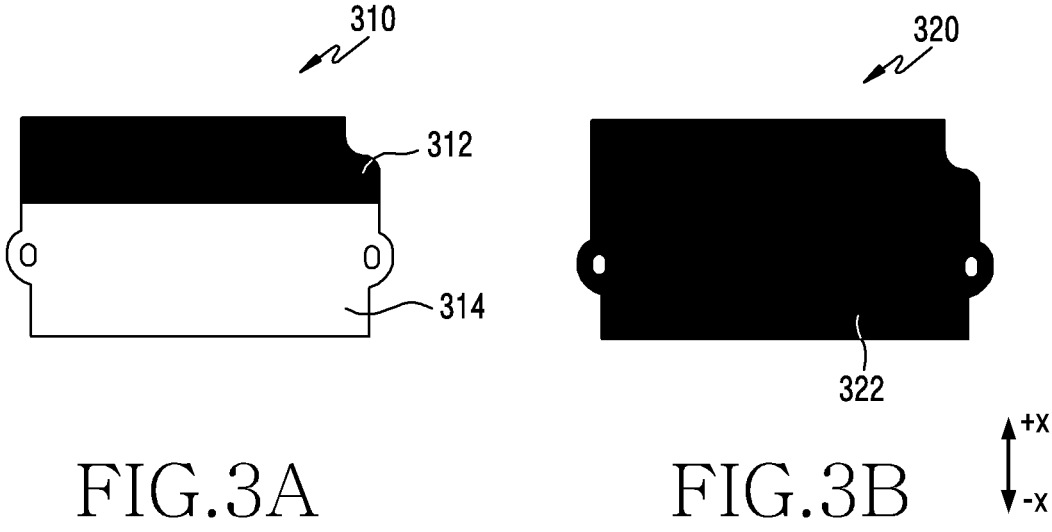
FIGS. 3A and 3B respectively illustrate a plan view of a flexible printed circuit board (FPCB) according to embodiments of the disclosure.

FIGS. 3A and 3B (alone or together hereinafter referred to as FIG. 3) respectively illustrate a plan view of a flexible printed circuit board (FPCB) according to embodiments of the disclosure.

Referring to FIG. 3, an FPCB 310 in which an EMI shield layer (dark area) is attached to only a portion of the FPCB, and an FPCB 320 in which an EMI shield layer is provided extending to the end (or edge) of the FPCB in the −x direction, are illustrated. The FPCB 310 may include a portion 312 where the EMI shield layer is provided (e.g., shield area) and a portion 314 where no EMI shield layer is provided (e.g., non-shield area). The FPCB 320 may include a portion 322 where the EMI shield layer is provided (e.g., shield area).

In an embodiment, the ratio occupied by the portion 314 where no EMI shield layer is provided may vary from case to case. A connector may serve to connect an FPCB to another PCB. The connector may be a connector of an external device (e.g., a ZIF connector), or may include a B2B connector (a board-to-board connector). When the EMI shield layer is provided on the connector portion, problems such as rigidity of the FPCB connector portion and a short circuit with a pad may occur during the formation of the FPCB connector portion. Therefore, the EMI shield layer may not be provided on the connector portion.

By providing the EMI shield layer to the lower end of the FPCB 320 according to an embodiment of the disclosure, an effect of shielding noise generated from the connector portion may be obtained. FIG. 3 illustrates a top view of the FPCB, and a bottom view of the FPCB may be different from that illustrated in FIG. 3.

Figure 4A:
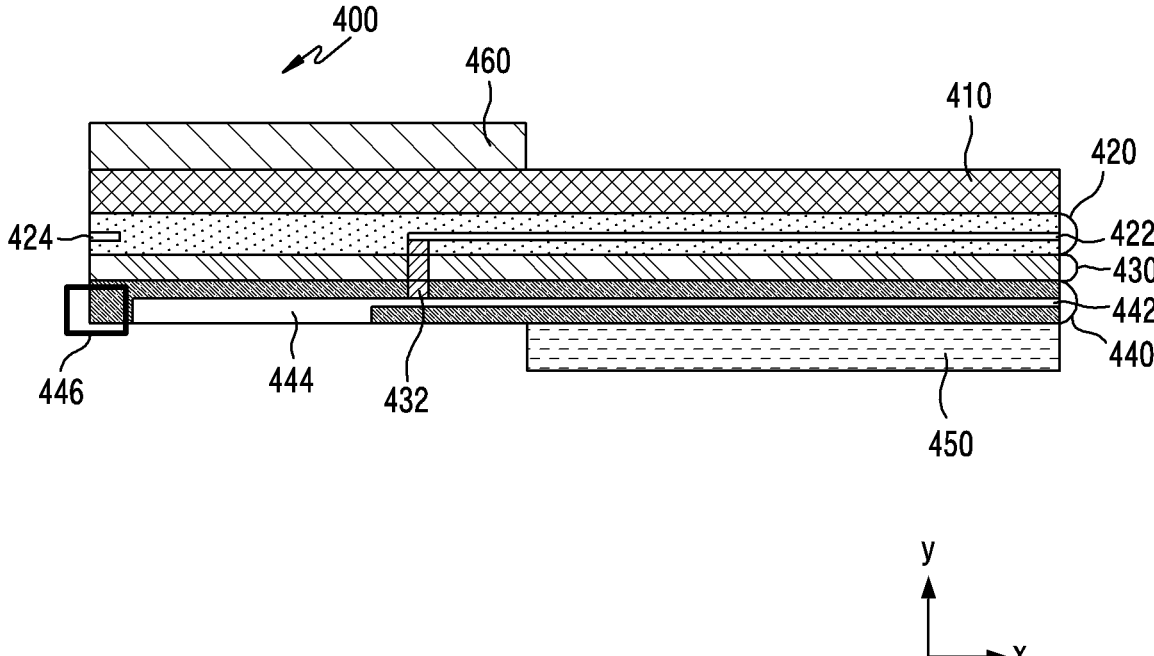
FIGS. 4A to 4C illustrate an example of the FPCB according to an embodiment of the disclosure.
Figure 4B:
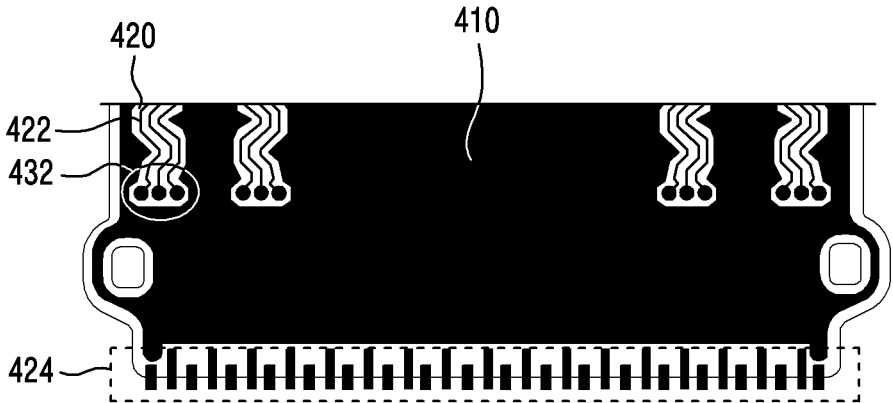
Figure 4C:
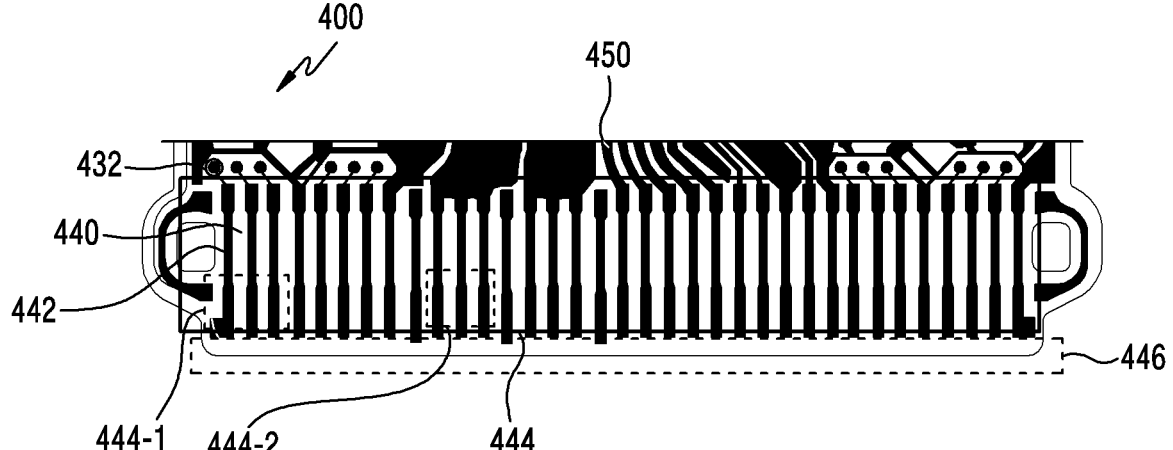

FIGS. 4A to 4C illustrate an FPCB 400 according to an embodiment of the disclosure.

FIG. 4A illustrates a cross-sectional view of the FPCB 400 according to an embodiment of the disclosure. The FPCB 400 illustrated in FIG. 4A may be the FPCB 320 illustrated in FIG. 3. The term "FPCB" disclosed in the following description may have a meaning corresponding to "flexible printed circuit (FPC)."

Referring to FIG. 4A, the FPCB 400 may include a first shield layer 410 (e.g., a first electromagnetic shielding layer), a first conductive layer 420, a base 430, a second conductive layer 440, a second shield layer 450 (e.g., a second electromagnetic shielding layer), and a reinforcing plate 460. The base 430 may be referred to as a "base substrate" or an "insulation layer."

In an embodiment, the first conductive layer 420 and second conductive layer 440 may be disposed or provided in the first and second directions of the base 430. Along the y axis direction, the first direction may mean the +y direction with respect to the base 430, and the second direction may mean the −y direction with respect to the base 430. The base 430 may be made of an insulating material and may serve to separate the first conductive layer 420 and the second conductive layer 440. A thickness direction of the electronic device, the FPCB 400 and/or various components or layers thereof may be defined along the y axis direction. The electronic device, the FPCB 400 and/or various components or layers thereof may be disposed in a plane defined by directions crossing each other, such as a third direction (x axis direction) and a fourth direction intersecting the third direction such a horizontal direction in FIG. 3, without being limited thereto. A plan view or top view may be a view of the plane, along the thickness direction.

In an embodiment, the first conductive layer 420 may include a first transmission line 422 through which an electrical signal flows. The first transmission line 422 may be made of a conductive material. In an embodiment, the first transmission line 422 may be disposed or provided adjacent to the base 430. For example, although not illustrated in the drawing, the first transmission line 422 and the base 430 may be attached to each other. That is, the first transmission line 422 and the base 430 may contact each other to be attached to each other, such as forming an interface therebetween and/or being directly attached to each other. The first transmission line 422 may be a conductive pattern provided on the upper surface of the base 430. A portion of the first conductive layer 420 that surrounds the first transmission line 422 may be made of an insulating material defining one or more insulating layer within the FPCB 400. That is, the insulating layer and the first transmission line 4212 may together define the first conductive layer 420. Accordingly, an electrical connection between the first shield layer 410 and the first transmission line 422 may be prevented.

In an embodiment, the second conductive layer 440 may include a second transmission line 442 through which an electrical signal flows. The second transmission line 442 may be made of a conductive material. In an embodiment, the second transmission line 442 may be disposed or provided adjacent to the base 430. For example, although not illustrated in the drawing, the second transmission line 442 and the base 430 may be attached to each other. The second transmission line 442 may be a conductive pattern provided on the lower surface of the base 430 which is opposite to the upper surface thereof. A portion of the second conductive layer 440 that surrounds the second transmission line 442 may be made of an insulating material. Accordingly, an electrical connection between the second shield layer 450 and the second transmission line 442 may be prevented. The "transmission line" disclosed in the following description may be referred to as a "wiring," a "wiring pattern," a "signal line," a "transmission line", a "signal line," or another term.

In an embodiment, the first conductive layer 420 and the second conductive layer 440 may be connected to each other through a via 432. The via 432 may be made of a conductive material. The via 432 may interconnect the first transmission line 422 and the second transmission line 442. The via 432 may be disposed or provided to penetrate the base 430. That is, the via 432 may extend completely through a thickness of the base 430. The first conductive layer 420 and the second conductive layer 440 may be connected to each other via the via 432 in the +x direction with respect to a terminal portion 444.

The terminal portion 444 may mean a portion of the second transmission line 442 which is exposed to the outside (e.g., outside of the FPCB 400) for connection with another component external to the FPCB 400. Specifically, the via 432 may be disposed or provided to pass through the base 430 while being connected to both the first transmission line 422 and the second transmission line 442. The via 432 may be disposed or provided to be spaced apart by a predetermined distance from the terminal portion 444 in the +x direction. Referring to FIG. 4A, along the x axis direction, the −x direction may mean a direction toward an end of the FPCB, and the +x direction may mean the direction opposite to the end of the FPCB.

In an embodiment, the terminal portion 444 may be disposed or provided on or as a part of the second conductive layer 440 of the FPCB 400. The terminal portion 444 may be connected to the second transmission line 442 and may be provided toward the end or edge of the FPCB 400. In the terminal portion 444, the second conductive layer 440 or the second transmission line 442 may be exposed to the outside of the FPCB 400 to be connected to a connector in an area spaced apart by a predetermined distance from the end area 446 adjacent to the end of the FPCB 400. A portion of an insulating layer may define the end area 446 and/or the edge of the FPCB 400 at the area 446.

A connector configured to connect the FPCB 400 to another component may be provided at the terminal portion 444. The terminal portion 444 may be provided on the second conductive layer 440. The terminal portion 444 may be disposed or provided in the −y direction, at a position spaced apart by a predetermined distance from the end of the FPCB of the second conductive layer 440, and may have a structure exposed to the outside to be electrically connected to an external terminal. The terminal portion 444 may be disposed or provided at the end (in the −x direction) of the FPCB. The terminal portion 444 may be referred to as a "connecting portion," an "inserting portion," or a "pad."

In an embodiment, the FPCB 400 may include a first shield layer 410. The first shield layer 410 may mean an EMI shield layer configured to electrically shield the FPCB 400 from electromagnetic energy or waves. The first shield layer 410 may be disposed or provided on the first conductive layer 420, in the +y direction. The first shield layer 410 may be disposed up to the end of the FPCB 400. That is, the first shield layer 410 may define an end or edge which coincides with or is aligned with the end of the FPCB 400.

The first shield layer 410 may be disposed to overlap (or correspond to) at least a portion of the terminal portion 444. Conventionally, since an EMI shield layer is not provided at the terminal portion of a connector, there is a problem due to (electrical) signal noise of a high-speed signal induced at the terminal portion. According to an embodiment of the disclosure, by extending the first shield layer 410 to the end of the FPCB and to correspond to the terminal portion, it is possible to obtain an effect of alleviating signal noise induced in the terminal portion. Although not illustrated in the drawings, another layer made of an insulating material may be disposed or provided on the first shield layer 410, in the +y direction.

In an embodiment, the FPCB 400 may include a second shield layer 450. The second shield layer 450 may mean an EMI shield layer configured to shield the FPCB 400. The second shield layer 450 may be disposed or provided on the second conductive layer 440, in the −y direction. Unlike the first shield layer 410, the second shield layer 450 may be provided or disposed on only a portion of the second conductive layer 440. That is, the second shield layer 450 may define an end or edge thereof which is spaced apart from the end of the FPCB 400. Specifically, the second shield layer 450 may not be provided or disposed at a portion where the terminal portion 444 is provided. That is, the second shield layer 450 may be provided or disposed adjacent to or spaced apart from the terminal portion 444, in directions along the plane defined by the x direction and the direction into the view of FIG. 4A. The second shield layer 450 may be disposed or provided to be spaced apart by a predetermined distance from the terminal portion 444 so as not to overlap the terminal portion 444. This is to enable the terminal portion 444 to be electrically connected to the connector. Although not illustrated in the drawings, another layer made of an insulating material may be disposed or provided at the lower end of the second shield layer 450, that is, in the −y direction.

In an embodiment, the FPCB 400 may include a reinforcing plate 460. The reinforcing plate 460 may serve to allow the FPCB 400 to be firmly connected to another component. The FPCB may be made of a flexibly bendable material, rather than a rigidly fixed material. Therefore, when the FPCB is connected to another component, the reinforcing plate 460 may be connected to strengthen the connected portion.

In an embodiment, the first conductive layer 420 may include (or define) a reinforcing line 424. The reinforcing line 424 may be located at an end of the first conductive layer 420, such as to define an end portion of the FPCB 400. In FIG. 4A, for example, a side surface of the reinforcing line 424 is exposed to outside the FPCB 400 and defines a portion of the side surface of the FPCB 400. The reinforcing line 424 may be disposed or provided to be spaced apart by a predetermined distance from the first transmission line 422, rather than being electrically connected to the first transmission line 422. That is, the reinforcing line 424 may be electrically disconnected from the first transmission line 422, within the first conductive layer 420. In an embodiment, the reinforcing line 424 and the first transmission line 422 may be in a same layer as each other. As being in a same layer, elements may be formed in a same process and/or as including a same material as each other, elements may be respective portions of a same material layer, elements may be on a same layer by forming an interface with a same underlying or overlying layer, etc., without being limited thereto.

The reinforcing line 424 may be a component configured to ensure the rigidity of the FPCB. The reinforcing line 424 may be a component configured to prevent components to be electrically separated from each other from being electrically connected to each other in the process of disposing the FPCB 400 in an electronic device. For example, since the first shield layer 410 is provided up to the end of the first conductive layer 420, the first shield layer 410 and the first conductive layer 420 may be electrically connected to each other. The reinforcing line 424 may be located at the end of the first conductive layer 420 to prevent the first shield layer 410 from being electrically connected to the first conductive layer 420.

In an embodiment, the reinforcing line 424 may be connected to a ground area (e.g., an electrical ground or an electrically grounded area) of the first transmission line 422.

In an embodiment, the transmission line or pattern may not be disposed in an area 446 adjacent to the end of the second conductive layer 440. Among the existing FPCBs, in the case of an FPCB including two conductive layers, the terminal portion disposed on the second conductive layer may be disposed up to the end of the FPCB. In the case where the terminal part is located up to the end of the FPCB, when the first shield layer extends to the end of the first conductive layer, the first shield layer may be electrically connected to the second conductive layer in the process of disposing the FPCB in an electronic device. According to an embodiment of the disclosure, in order to prevent the first shield layer 410 and the second conductive layer 440 from being electrically connected to each other due to the extension of the first shield layer 410 up to the end of the FPCB, the terminal portion 444 may be disposed to be spaced apart by a predetermined distance from the end. In more detail, an insulating area may be disposed to at the end area 446 to prevent the first shield layer 410 and the second conductive layer 440 from being electrically connected to each other due to the extension of the first shield layer 410 up to the end of the FPCB. When a transmission line or a via to connected to the terminal portion is disposed at the end of the second conductive layer, it may be deleted or removed.

FIG. 4B illustrates the first conductive layer 420 of the FPCB 400 illustrated in FIG. 4A.

In an embodiment, the first conductive layer 420 may include a first transmission line 422 through which an electrical signal flows. The first transmission line 422 may be made of a conductive material.

In an embodiment, the first conductive layer 420 and the second conductive layer 440 may be connected to each other through a via 432. The via 432 may be made of a conductive material. The via 432 may interconnect the first transmission line 422 and the second transmission line 442. The via 432 may be disposed or provided to penetrate the base 430. The first conductive layer 420 and the second conductive layer 440 may be connected to each other via the via 432, at a side of the FPCB 400 which is opposite to the side at which a terminal portion 444 is provided. According to an embodiment, the via 432 may be disposed or provided to pass through the base 430 while being connected to the first transmission line 422 and the second transmission line 442. The via 432 may be disposed or provided to be spaced apart by a predetermined distance from the end 446 of the FPCB 400. The via 432 may be disposed or provided to be spaced apart by a predetermined distance from the terminal portion 444, in the x direction (vertical direction in FIGS. 4B and 4C).

The via 432 may be provided in plural including a plurality of vias 432. In FIG. 4B, for example, plural individual vias are included in the circle labeled 432, while an individual via 432 is labeled in FIG. 4C. That is, as used within the disclosures, a reference number labeling a singular form of an element within the figures may be used to reference a plurality of the singular element within the text of the disclosure. In either case, a plurality of vias 432 are arranged along an edge of the FPCB 400, to be spaced apart from each other along a planar direction crossing the x direction.

In an embodiment, the FPCB 400 may include a first shield layer 410. The first shield layer 410 may mean an EMI shield layer configured to shield the FPCB 400. As illustrated in FIG. 4B, the first shield layer 410 of the FPCB may extend to the end of the FPCB 400 and may be attached thereto. The first shield layer 410 may be disposed to overlap at least a portion of the terminal portion 444. Conventionally, since an EMI shield layer is not provided on the terminal portion of a connector, there is a problem due to signal noise of a high-speed signal induced at the terminal portion. According to an embodiment of the disclosure, by extending the first shield layer 410 to the end of the FPCB, it is possible to obtain an effect of alleviating signal noise induced in the terminal portion.

The reinforcing line 424 may mean the conductive patterns or lines in the dotted line area illustrated in FIG. 4B. The reinforcing line 424 may be a component configured to prevent layers to be electrically separated from each other from being electrically connected to each other in the process of disposing the FPCB 400 in an electronic device. For example, since the first shield layer 410 is provided up to the end of the first conductive layer 420, the first shield layer 410 and the first conductive layer 420 may be electrically connected to each other. The reinforcing line 424 may be located at the end of the first conductive layer 420 to prevent the first shield layer 410 from being electrically connected to the first conductive layer 420.

In an embodiment, the reinforcing line 424 may be connected to a ground area of the first transmission line.

FIG. 4C illustrates the second conductive layer 440 of the FPCB 400 illustrated in FIG. 4A.

In an embodiment, the second conductive layer 440 may include a second transmission line 442 through which an electrical signal flows. The second transmission line 442 may be made of a conductive material.

In an embodiment, the first conductive layer 420 and the second conductive layer 440 may be connected to each other through a via 432. The via 432 may be made of a conductive material. The via 432 may interconnect the first transmission line 422 and the second transmission line 442. The via 432 may be disposed or provided to penetrate the base 430. According to an embodiment, the via 432 may be disposed or provided to pass through the base 430 while being connected to the first transmission line 422 and the second transmission line 442. The via 432 may be disposed or provided to be spaced apart by a predetermined distance from the terminal portion 444.

In an embodiment, the terminal portion 444 may be disposed or provided on the second conductive layer 440 of the FPCB 400. The terminal portion 444 may mean the area indicated by the solid line box in FIG. 4C, that is, a terminal area. A connector configured to connect the FPCB to another component may be inserted into or connected to the terminal portion 444. The terminal portion 444 may be provided on the second conductive layer 440. The terminal portion 444 may be disposed or provided at a position spaced apart by a predetermined distance from the end of the FPCB, and may have a structure exposed to the outside to be electrically connected to an external terminal. The terminal portion 444 may be disposed or provided at an end of the FPCB.

The terminal portion 444 may include a first terminal portion 444-1 connected to a first signal line(s) electrically connected to the first transmission line 422 of the first conductive layer 420 via the via 432, together with a second terminal portion 444-2 electrically connected to second signal line(s) disposed on the second transmission line 442. The terminal portion 444 may be referred to as a "connecting portion," an "inserting portion," a "pad," or another term.

In an embodiment, the FPCB 400 may include a second shield layer 450. The second shield layer 450 may mean an EMI shield layer configured to shield the FPCB 400. The second shield layer 450 may be disposed or provided on the second conductive layer 440, in the −y direction. Unlike the first shield layer 410, the second shield layer 450 may be provided or disposed on only a portion of the second conductive layer 440, in the −y direction. According to an embodiment, the second shield layer 450 may not be provided or disposed at a portion where the terminal portion 444 is provided. The second shield layer 450 may be disposed or provided to be spaced apart by a predetermined distance from the terminal portion 444 so as not to overlap the terminal portion 444. The terminal portion 444 may be electrically connected to the connector.

In an embodiment, a transmission line or pattern may not be disposed in an area 446 adjacent to the end of the FPCB

400. Among the existing FPCBs, in the case of an FPCB including two conductive layers, the terminal portion disposed on or defined by the second conductive layer may be disposed up to the end of the FPCB. In the case where the terminal portion is located up to the end of the FPCB, when the first shield layer extends up to the end of the first conductive layer, components to be electrically separated may be electrically connected to each other in the process of disposing the FPCB in an electronic device. According to an embodiment according to the disclosure, in order to prevent components to be electrically separated from each other from being electrically connected to each other that due to the extension of the first shield layer 410 up to the end of the FPCB, the terminal portion 444 may be disposed to be spaced apart by a predetermined distance from the end. When a transmission line or a via to be connected to the terminal portion 444 is disposed at the end of the second conductive layer, it may be deleted or removed.

Figure 5A:
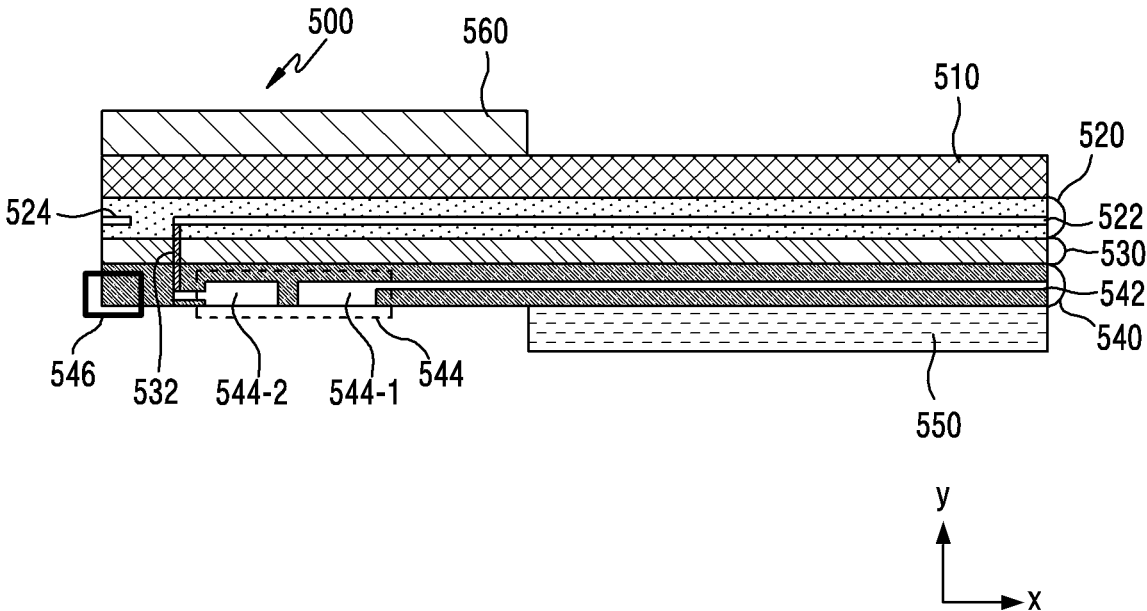
FIGS. 5A to 5C illustrate an example of the FPCB according to an embodiment of the disclosure.
Figure 5B:
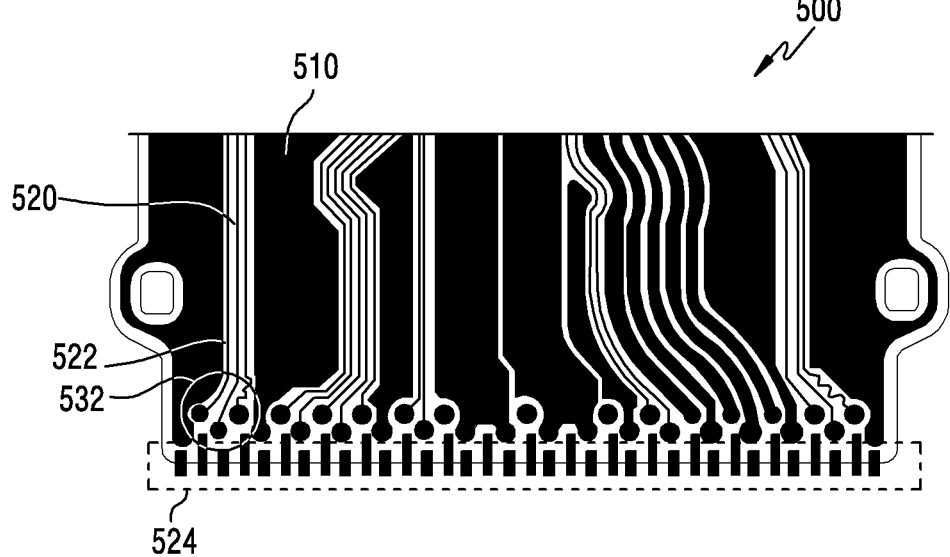
Figure 5C:
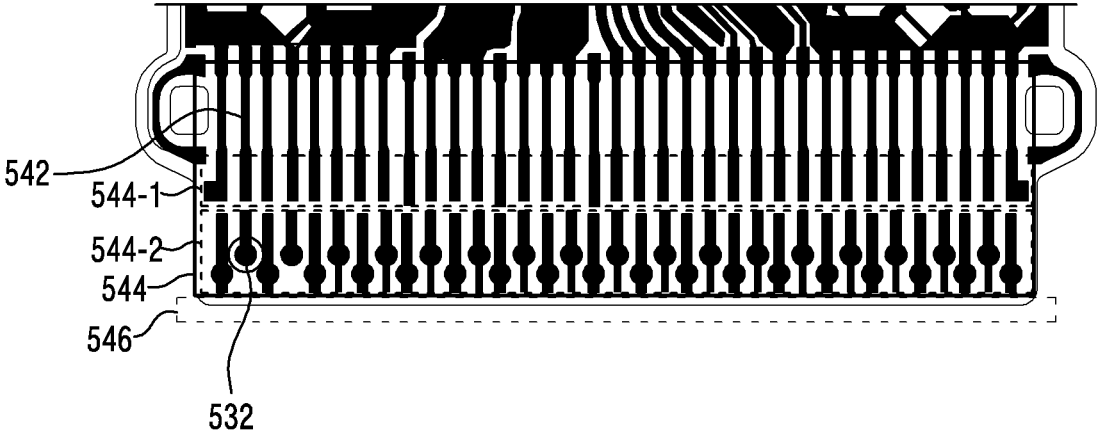

FIGS. 5A to 5C illustrate an FPCB 500 according to an embodiment of the disclosure.

FIG. 5A illustrates a cross-sectional view of the FPCB 500 according to an embodiment of the disclosure. The FPCB 500 illustrated in FIG. 5A may be one type of the FPCB 320 illustrated in FIG. 3. The term "FPCB" disclosed in the following description may have a meaning corresponding to "flexible printed circuit (FPC)."

Referring to FIG. 5A, the FPCB 500 may include a first shield layer 510, a first conductive layer 520, a base 530, a second conductive layer 540, a second shield layer 550, and a reinforcing plate 560. The base 530 may be referred to as a "base substrate," an "insulation layer", or another term.

In an embodiment, the first conductive layer 520 and the second conductive layer 540 may be disposed or provided in the first and second directions of the base 530, respectively. The first direction may mean the +y direction with respect to the base 530, and the second direction may mean the −y direction with respect to the base 530. The base 530 may be made of an insulating material and may serve to separate the first conductive layer 520 and the second conductive layer 540.

In an embodiment, the first conductive layer 520 may include a first transmission line 522 through which an electrical signal flows. In an embodiment, the first transmission line 522 may be disposed or provided adjacent to the base 530. For example, although not illustrated in the drawing, the first transmission line 522 and the base 530 may be attached to each other. The first transmission line 522 may be a conductive pattern provided on the upper surface of the base 530. A portion of the first conductive layer 520 that surrounds the first transmission line 522 may be made of an insulating material. Accordingly, an electrical connection between the first shield layer 510 and the first transmission line 522 may be prevented. In an embodiment, the first transmission line 522 may be made of a conductive material.

The second conductive layer 540 may include a second transmission line 542 through which an electrical signal flows. In an embodiment, the second transmission line 542 may be disposed or provided adjacent to the base 530. For example, although not illustrated in the drawing, the second transmission line 542 and the base 530 may be attached to each other. The second transmission line 542 may be a conductive pattern provided on the lower surface of the base 530. A portion of the second conductive layer 540 that surrounds the second transmission line 542 may be made of an insulating material. Accordingly, an electrical connection between the second shield layer 550 and the second transmission line 542 may be prevented. The second transmission line 542 may be made of a conductive material. The term "transmission line" disclosed in the following description may have meanings corresponding to a "wiring," a "wiring pattern," a "transmission line," and a "signal line."

In an embodiment, the first conductive layer 520 and the second conductive layer 540 may be connected to each other through a via 532. The via 532 may be made of a conductive material. The via 532 may interconnect the first transmission line 522 and the second transmission line 542. The via 532 may be disposed or provided to penetrate the base 530. The first conductive layer 520 and the second conductive layer 540 may be connected to each other via the via 532 in the −x direction with respect to the terminal portion 544. The terminal portion 544 may mean a portion or a planar area where the second transmission line is exposed to the outside for connection with another component (e.g., exposed portion of the second transmission line 542).

In an embodiment, the via 532 may be exposed to the outside of the FPCB 500 and may serve as a terminal portion. Specifically, the via 532 may be disposed or provided to pass through the base 530 while being connected to the first transmission line 522 and the second transmission line 542. The via 532 may be disposed or provided at a predetermined distance from the terminal portion 544 in the −x direction. Referring to FIG. 5A, the −x direction may mean the direction toward an end of the FPCB, and the +x direction may mean the direction opposite to the end of the FPCB. In another embodiment, the via 532 may be directly connected to terminal portion 544.

In an embodiment, the terminal portion 544 may be disposed or provided on or by portions of the second conductive layer 540 of the FPCB 500. The terminal portion 544 may be connected to the second transmission line and may be provided toward the end of the FPCB 500. In the terminal portion 544, the second conductive layer 540 or the second transmission line 542 may be exposed to the outside to be connected to the connector in an area spaced apart by a predetermined distance from the area 546 adjacent to the end of the FPCB 500 (e.g., end area). A connector configured to connect the FPCB to another component may be inserted into or connected to the FPCB at the terminal portion 544. The connector may be a connector of an external device (e.g., a ZIF connector), or may include a B2B connector (a board-to-board connector).

In an embodiment, the terminal portion 544 may be disposed or provided on the second conductive layer 540. The terminal portion 544 may be disposed or provided at a position spaced apart by a predetermined distance from the end of the FPCB, and may have a structure exposed to the outside to be electrically connected to an external terminal. The terminal portion 444 may be referred to as an "inserting portion," a "connecting portion," a "pad," or another term.

In an embodiment, the FPCB 500 may include a first shield layer 510. The first shield layer 510 may mean an EMI shield layer configured to shield the FPCB 500. The first shield layer 510 may be disposed or provided on the first conductive layer 520 in the +y direction. The first shield layer 510 may be attached to an end of the FPCB 500. The first shield layer 510 may be disposed to overlap at least a portion of the terminal portion 544. Conventionally, since an EMI shield layer is not attached to the terminal portion of a connector, there is a problem due to signal noise of a high-speed signal induced at the terminal portion. According to an embodiment of the disclosure, by extending the first shield layer 510 to the end of the FPCB, it is possible to obtain an effect of alleviating signal noise induced in the terminal portion. Although not illustrated in the drawings, another layer made of an insulating material may be disposed or provided on the first shield layer 510.

In an embodiment, the FPCB 500 may include a second shield layer 550. The second shield layer 550 may mean an EMI shield layer configured to shield the FPCB 500. The second shield layer 550 may be disposed or provided on the second conductive layer 540 in the −y direction. Unlike the first shield layer 510, the second shield layer 550 may be provided or disposed on only a portion of the second conductive layer 540. Specifically, the second shield layer 550 may not be provided or disposed at a portion where the terminal portion 544 is provided. The second shield layer 550 may be disposed or provided to be spaced apart by a predetermined distance from the terminal portion 544 so as not to overlap the terminal portion 544. This is to enable the terminal portion 544 to be electrically connected to the connector. Although not illustrated in the drawings, another layer made of an insulating material may be disposed or provided at the lower end of the second shield layer 550.

In an embodiment, the FPCB 500 may include a reinforcing plate 560. The reinforcing plate 560 may serve to allow the FPCB 500 to be firmly connected to another component. The FPCB may be made of a flexibly bendable material, rather than a rigidly fixed material. Therefore, when the FPCB is connected to another component, the reinforcing plate 560 may be connected to strengthen the connected portion.

In an embodiment, the first conductive layer 520 may include a reinforcing line 524. The reinforcing line 524 may be located at an end of the first conductive layer 520. The reinforcing line 524 may be disposed or provided to be spaced apart by a predetermined distance from the first transmission line 522, rather than being electrically connected to the first transmission line 422. The reinforcing line 524 may be a component configured to ensure the rigidity of the FPCB. The reinforcing line 524 may be a component configured to prevent components to be electrically separated from each other from being electrically connected to each other in the process of disposing the FPCB 500 in an electronic device. For example, since the first shield layer 510 is provided up to the end of the first conductive layer 520, the first shield layer 510 may be electrically connected to the second conductive layer 540. The reinforcing line 524 may be located at the end of the first conductive layer 520 to prevent the first shield layer 510 from being electrically connected to the first conductive layer 520.

In an embodiment, the transmission line or pattern may not be disposed in an area 546 adjacent to the end of the second conductive layer 540. That is, the transmission line or pattern may terminate at a distance from the end area, in a direction along the base 530. Among the existing FPCBs, in the case of an FPCB including two conductive layers, the terminal portion disposed on the second conductive layer may be disposed up to the end of the FPCB. In the case where the terminal part is located up to the end of the FPCB, when the first shield layer extends to the end of the first conductive layer, the first shield layer may come into contact with the second conductive layer to be electrically connected to the second conductive layer in the process of disposing the FPCB in an electronic device. According to an embodiment of the disclosure, in order to prevent the first shield layer 510 from being electrically connected to the second conductive layer 540 due to the extension of the first shield layer 510 up to the end of the FPCB, the terminal portion 544 may be disposed to be spaced apart by a predetermined distance from the end. When a transmission line or a via to connected to the terminal portion is disposed at the end of the second conductive layer, it may be deleted or removed.

FIG. 5B illustrates the first conductive layer 520 of the FPCB 500 illustrated in FIG. 5A.

In an embodiment, the first conductive layer 520 may include a first transmission line 522 through which an electrical signal flows. The first transmission line 522 may be made of a conductive material.

In an embodiment, the first conductive layer 520 and the second conductive layer 540 may be connected to each other through a via 532. The via 532 may be made of a conductive material. The via 532 may interconnect the first transmission line 522 and the second transmission line 542. The via 532 may be disposed or provided to penetrate the base 530. The first conductive layer 520 and the second conductive layer 540 may be connected to each other via the via 532 in a direction toward the end of the FPCB 500 with respect the terminal portion 544.

According to an embodiment, the via 532 may be disposed or provided to pass through the base 530 while being connected to the first transmission line 522 and the second transmission line 542. The via 532 may be disposed or provided to be spaced apart by a predetermined distance from the end of the FPCB 500. A plurality of vias 532 may be arranged along an edge of the FPCB 500. In FIG. 5B, for example, a group of vias 532 includes more than one via 532, and a plurality of groups are arranged along the edge of the FPCB 500. Although not illustrated in the drawing, the via 532 may be disposed or provided at a predetermined distance from the terminal portion 544. The via 532 may be disposed or provided at a predetermined distance from the terminal portion 544 in the −x direction.

In an embodiment, the FPCB 500 may include a first shield layer 510. The first shield layer 510 may mean an EMI shield layer configured to shield the FPCB 500. As illustrated in FIG. 5B, the first shield layer 510 of the FPCB 500 may extend to the end of the FPCB 500 and may be attached thereto. The first shield layer 510 may be disposed to overlap at least a portion of the terminal portion 544. Conventionally, since an EMI shield layer is not provided on the terminal portion of a connector, there is a problem due to signal noise of a high-speed signal induced at the terminal portion. According to an embodiment of the disclosure, by extending the first shield layer 510 to the end of the FPCB, it is possible to obtain an effect of alleviating signal noise induced in the terminal portion.

The reinforcing line 524 may mean lines included in the dotted line area illustrated in FIG. 5B. The reinforcing line 524 may be a component configured to prevent components to be electrically separated from each other from being electrically connected to each other in the process of disposing the FPCB 500 in an electronic device. For example, since the first shield layer 510 is provided up to the end of the first conductive layer 520, the first shield layer 510 and the first conductive layer 520 may be electrically connected to each other. The reinforcing line 524 may be located at the end of the first conductive layer 520 to prevent the first shield layer 510 from being electrically connected to the first conductive layer 520.

In an embodiment, the reinforcing line 524 may be connected to a ground area of the first transmission line.

FIG. 5C illustrates the second conductive layer 540 of the FPCB 500 illustrated in FIG. 5A.

In an embodiment, the second conductive layer 540 may include a second transmission line 542 through which an electrical signal flows. The second transmission line 542 may be made of a conductive material.

In an embodiment, the first conductive layer 520 and the second conductive layer 540 may be connected to each other through a via 532. The via 532 may be made of a conductive material. The via 532 may interconnect the first transmission line 522 and the second transmission line 542. The via 532 may be disposed or provided to penetrate the base 530. According to an embodiment, the via 532 may be disposed or provided to pass through the base 530 while being connected to the first transmission line 522 and the second transmission line 542. The via 532 may be disposed or provided in an area spaced apart by a predetermined distance from the area 546 adjacent to the end of the FPCB 500.

In an embodiment, the terminal portion 544 may be disposed or provided on the second conductive layer 540 of the FPCB 500. The terminal portion 544 may mean the area indicated by the solid line box in FIG. 5C, to define a terminal area. The terminal portion 544 may be inserted into a connector of another component to connect the FPCB 500 to the another component. A connector for connecting the FPCB 500 to another component may be disposed in the terminal portion 544. The connector may be a connector of an external device (e.g., a ZIF connector), or may include a B2B connector (a board-to-board connector). The terminal portion 544 may be disposed or provided in the second conductive layer 540 in the direction toward the end of the FPCB, and may have a structure exposed to the outside to be electrically connected to an external terminal. The terminal portion 544 may be disposed or provided at a location at a predetermined distance from the area adjacent to the end of the FPCB.

The terminal portion 544 may include a first terminal portion 544-1 exposed to the outside through the second transmission line 542. The terminal portion 544 may include a second terminal portion 544-2 connected to the first transmission line 522 via the via 532 and exposed to the outside. The second terminal portion 544-2 may be connected to the second transmission line 542 via the via 532 provided in the direction toward the end of the FPCB with respect to the terminal portion 544. The first terminal portion 544-1 and the second terminal portion 544-2 may be disposed or provided to be spaced apart by a predetermined distance from each other. The terminal portion 544 may be referred to as a "connecting portion," an "inserting portion," a "pad," or another term.

In an embodiment, a transmission line or pattern may not be disposed in an area 546 adjacent to the end of the FPCB 500. Among the existing FPCBs, in the case of an FPCB including two conductive layers, the terminal portion disposed on the second conductive layer may be disposed up to the end of the FPCB. In the case where the terminal portion is located up to the end of the FPCB, when the first shield layer extends up to the end of the first conductive layer, components to be electrically separated may be electrically connected to each other in the process of disposing the FPCB in an electronic device. According to an embodiment according to the disclosure, in order to prevent components to be electrically separated from each other from being electrically connected to each other that due to the extension of the first shield layer 510 up to the end of the FPCB, the terminal portion 544 may be disposed to be spaced apart by a predetermined distance from the end of the FPCB 500. When a transmission line or a via to be connected to the terminal portion 544 is disposed at the end of the second conductive layer 540, it may be deleted or removed.

Figure 6A:
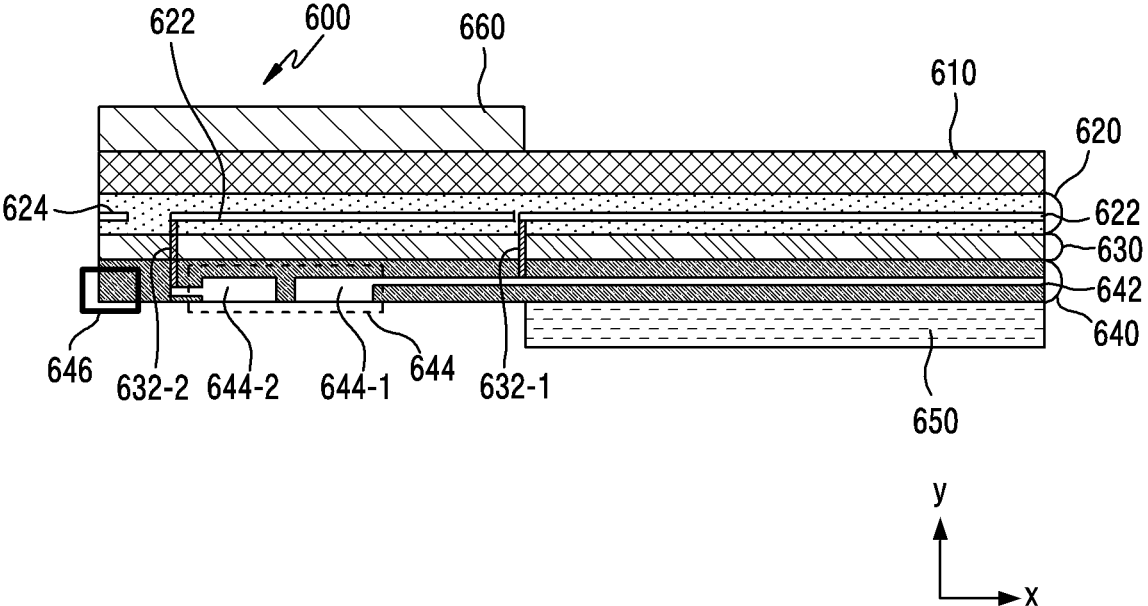
FIGS. 6A to 6C illustrate an example of the FPCB according to an embodiment of the disclosure.
Figure 6B:
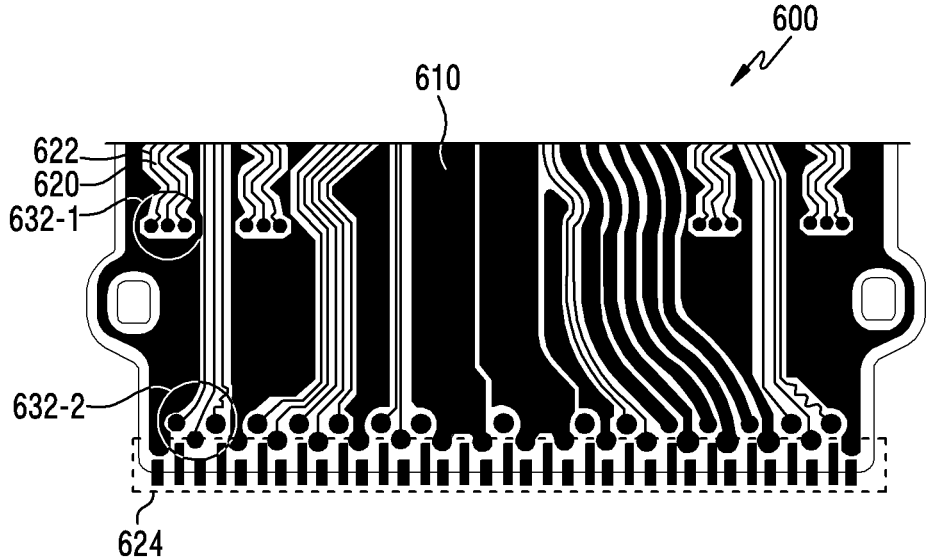
Figure 6C:
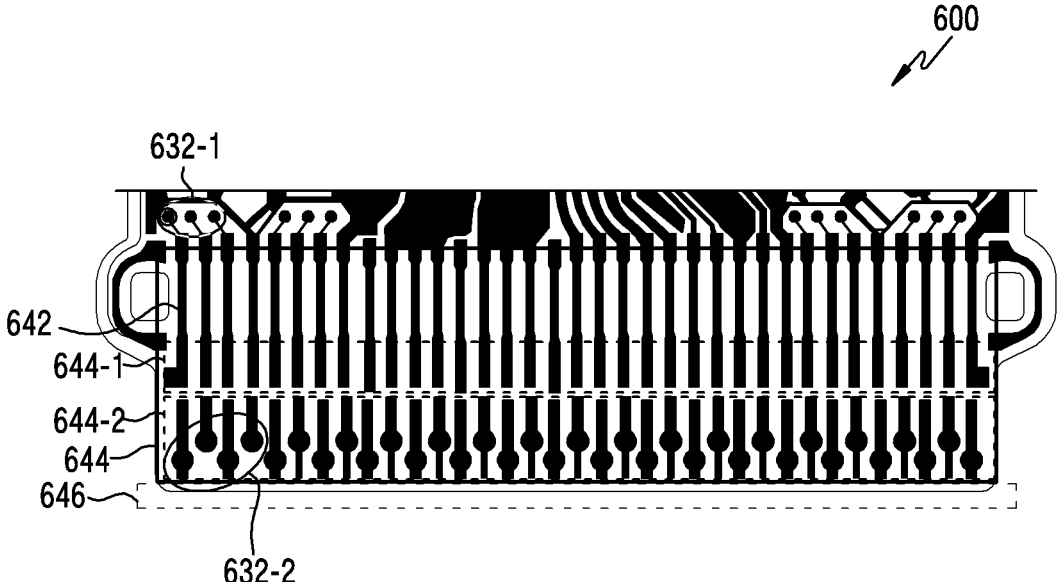

FIGS. 6A to 6C illustrate an FPCB according to various embodiments of the disclosure.

FIG. 6A illustrates a cross-sectional view of the FPCB 600 according to an embodiment of the disclosure. The FPCB 600 illustrated in FIG. 6A may be the FPCB 320 illustrated in FIG. 3. The term "FPCB" disclosed in the following description may have a meaning corresponding to "flexible printed circuit (FPC)." FIG. 6A illustrates a cross-sectional view of the FPCB 600 that corresponds to a cross-sectional view of the FPCB 320, in which the FPCB 600 may have a structure including all the structural features of FIGS. 4A and 5A.

Referring to FIG. 6A, the FPCB 600 may include a first shield layer 610, a first conductive layer 620, a base 630, a second conductive layer 640, a second shield layer 650, and a reinforcing plate 660. The base 630 may be referred to as a "base substrate," an "insulation layer", or another term.

In an embodiment, the first conductive layer 620 and the second conductive layer 640 may be respectively disposed or provided in the first and second directions of the base 630. The first direction may mean the +y direction with respect to the base 630, and the second direction may mean the −y direction with respect to the base 630. The base 630 may be made of an insulating material and may serve to separate the first conductive layer 620 and the second conductive layer 640.

In an embodiment, the first conductive layer 620 may include a first transmission line 622 through which an electrical signal flows. The first transmission line 622 may be made of a conductive material. In an embodiment, the first transmission line 622 may be disposed or provided adjacent to the base 630. For example, although not illustrated in the drawing, the first transmission line 622 and the base 630 may be attached to each other. The first transmission line 622 may be a conductive pattern provided on the upper surface of the base 630. A portion of the first conductive layer 620 that surrounds the first transmission line 622 may be made of an insulating material. Accordingly, an electrical connection between the first shield layer 610 and the first transmission line 622 may be prevented.

In an embodiment, the second conductive layer 640 may include a second transmission line 642 through which an electrical signal flows. The second transmission line 642 may be made of a conductive material. In an embodiment, the second transmission line 642 may be disposed or provided adjacent to the base 630. For example, although not illustrated in the drawing, the second transmission line 642 and the base 630 may be attached to each other. The second transmission line 642 may be a conductive pattern provided on the lower surface of the base 630. A portion of the second conductive layer 640 that surrounds the second transmission line 642 may be made of an insulating material. Accordingly, an electrical connection between the second shield layer 650 and the second transmission line 642 may be prevented. The "transmission line" disclosed in the following description may be referred to as a "wiring," a "wiring pattern," a "signal line," a "transmission line", or another term.

In an embodiment, the first conductive layer 620 and the second conductive layer 640 may be connected to each other via the vias 632-1 and 632-2. The vias 632-1 and 632-2 may be made of a conductive material. The vias 632-1 and 632-2 may interconnect the first transmission line 622 and the second transmission line 642. The vias 632-1 and 632-2 may be disposed or provided to penetrate the base 630.

In an embodiment, the first conductive layer 620 and the second conductive layer 640 may be connected to each other via the via 632-1 (e.g., a first via) in the +x direction with respect to the terminal portion 644. Specifically, the via 632-1 may be disposed or provided to pass through the base 630 while being connected to the first transmission line 622 and the second transmission line 642. The via 632-1 may be disposed or provided at a predetermined distance from the terminal portion 644 in the −x direction.

In an embodiment, the first conductive layer 620 and the second conductive layer 640 may be connected to each other via the via 632-2 (e.g., a second via) in the −x direction with respect to the terminal portion 644. Specifically, the via 632-2 may be disposed or provided to pass through the base 630 while being connected to the first transmission line 522 and the second transmission line 642. The via 632-2 may be disposed or provided at a predetermined distance from the terminal portion 644 in the +x direction.

Referring to FIG. 6A, the −x direction may mean a direction toward an end of the FPCB, and the +x direction may mean the direction opposite to the end of the FPCB. In another embodiment, a connector may be electrically coupled in the +x direction of the FPCB 600 as well for connection with another component.

In an embodiment, the terminal portion 644 may be disposed or provided on the second conductive layer 640 of the FPCB 600. Referring to FIG. 6A, the terminal portion 644 may mean the area indicated by the dotted line.

In an embodiment, the terminal portion 644 may be connected to the second transmission line, and provided toward the end of the FPCB 600 to be exposed to the outside. The terminal portion 644 may be exposed to the outside to be connected to a connector in an area spaced apart by a predetermined distance from the area 646 adjacent to the end of the FPCB 600. A connector configured to connect the FPCB to another component may be inserted into the terminal portion 644. The connector may be a connector of an external device (e.g., a ZIF connector), or may include a B2B connector (a board-to-board connector). The terminal portion 644 may be provided on the second conductive layer 640. The terminal portion 644 may be disposed or provided at a position spaced apart by a predetermined distance from the end of the FPCB 600, and may have a structure exposed to the outside to be electrically connected to an external terminal. The terminal portion 644 may be disposed or provided at the end (in the −x direction) of the FPCB.

In an embodiment, the terminal portion 644 may include a first terminal portion 644-1 and a second terminal portion 644-2. The first terminal portion 644-1 and the second terminal portion 644-2 may be disposed or provided to be spaced apart by a predetermined distance from each other. The second terminal portion 644-2 may mean a portion where the first transmission line 622 and the second transmission line 642 connected to each other via the second via 632-2 are exposed to the outside. The first terminal portion 644-1 may mean a portion where the first transmission line 622 and the second transmission line connected to each other via the first via 632-1 are exposed to the outside. The terminal portions 644, 644-1, and 644-2 may be referred to as "connecting portions," "inserting portions," "pads," or another term.

In an embodiment, the FPCB 600 may include a first shield layer 610. The first shield layer 610 may mean an EMI shield layer configured to shield the FPCB 600. The first shield layer 610 may be disposed or provided on the first conductive layer 620 in the +y direction. The first shield layer 610 may be attached to an end of the FPCB 600. The first shield layer 610 may be disposed to overlap at least a portion of the terminal portion 644. Conventionally, since an EMI shield layer is not attached to the terminal portion of a connector, there is a problem due to signal noise of a high-speed signal induced at the terminal portion. According to an embodiment of the disclosure, by extending the first shield layer 610 to the end of the FPCB, it is possible to obtain an effect of alleviating signal noise induced in the terminal portion.

In an embodiment, the FPCB 600 may include a second shield layer 650. The second shield layer 650 may mean an EMI shield layer configured to shield the FPCB 600. The second shield layer 650 may be disposed or provided on the second conductive layer 640 in the −y direction. Unlike the first shield layer 610, the second shield layer 650 may be provided or disposed on only a portion of the second conductive layer 640. Specifically, the second shield layer 650 may not be provided or disposed at a portion where the terminal portion 644 is provided. The second shield layer 650 may be disposed or provided to be spaced apart by a predetermined distance from the terminal portion 644 so as not to overlap the terminal portion 444. This is to enable the terminal portion 644 to be electrically connected to the connector.

In an embodiment, the FPCB 600 may include a reinforcing plate 660. The reinforcing plate 660 may serve to allow the FPCB 600 to be firmly connected to another component. The FPCB may be made of a flexibly bendable material, rather than a rigidly fixed material. Therefore, when the FPCB is connected to another component, the reinforcing plate 660 may be connected to strengthen the connected portion.

In an embodiment, the first conductive layer 620 may include a reinforcing line 624. The reinforcing line 624 may be located at an end of the first conductive layer 620. The reinforcing line 624 may be disposed or provided to be spaced apart by a predetermined distance from the first transmission line 622, rather than being electrically connected to the first transmission line 422. The reinforcing line 624 may be a component configured to ensure the rigidity of the FPCB. The reinforcing line 624 may be a component configured to prevent components to be electrically separated from each other from being electrically connected to each other in the process of disposing the FPCB 600 in an electronic device. For example, since the first shield layer 610 is provided up to the end of the first conductive layer 620, the first shield layer 610 may be electrically connected to the second conductive layer 620. The reinforcing line 624 may be located at the end of the first conductive layer 620 to prevent the first shield layer 610 from being electrically connected to the first conductive layer 620.

In an embodiment, the transmission line or pattern may not be disposed in an area 646 adjacent to the end of the second conductive layer 640. Among the existing FPCBs, in the case of an FPCB including two conductive layers, the terminal portion disposed on the second conductive layer may be disposed up to the end of the FPCB. In the case where the terminal part is located up to the end of the FPCB, when the first shield layer extends to the end of the first conductive layer, the first shield layer and the second conductive layer may be electrically connected to each other in the process of disposing the FPCB in an electronic device. According to an embodiment of the disclosure, in order to prevent the first shield layer 610 and the second conductive layer 640 from being shorted due to the extension of the first shield layer 610 up to the end of the FPCB, the terminal portion 644 may be disposed to be spaced apart by a predetermined distance from the end. When a transmission line or a via to connected to the terminal portion is disposed at the end of the second conductive layer, it may be deleted or removed.

FIG. 6B illustrates the first conductive layer 620 of the FPCB 600 illustrated in FIG. 6A.

Referring to FIG. 6B, the first shield layer 610, the first transmission line 622, the first conductive layer 620, the first via 632-1, the second via 632-2, and the reinforcing lines 624 are illustrated.

In an embodiment, the first conductive layer 620 may include a first transmission line 622 through which an electrical signal flows. The first transmission line 622 may be made of a conductive material.

In an embodiment, the first conductive layer 620 and the second conductive layer 640 may be connected to each other via the first via 632-1 and the second via 632-2. The first via 632-1 and the second via 632-2 may be made of a conductive material. The first via 632-1 and the second via 632-2 may serve to electrically interconnect the first transmission line 622 and the second transmission line 642. The first via 632-1 and the second via 632-2 may be disposed or provided to penetrate the base 630. In an embodiment, the first via 632-1 and the second via 632-2 may serve to electrically interconnect a plurality of first transmission lines 622 and a plurality of second transmission lines 642, respectively to each other. Referring to FIG. 6B, for example, a first group of first transmission lines 622 extends along the base 630 and toward the area 646 (e.g., those ending at the first vias 632-1 in the circled area), while a second group of first transmission lines 622 which is adjacent to the first group extends along the base 630 and toward the area 646 (e.g., those ending at the second vias 632-2 in the circled area). That is, the left and right first transmission lines 622 in FIG. 6A may be arranged adjacent to each other along a direction into the view of FIG. 6A or along the horizontal direction of FIG. 6B.

In an embodiment, the first via 632-1 may be disposed or provided at a predetermined distance from the end of the FPCB in the opposite direction. Referring to FIG. 6B, the first via 632-1 may be disposed or provided at a position spaced apart from the terminal portion 644 by a predetermined distance in the opposite direction in the FPCB 600. The first via 632-1 may be disposed or provided to penetrate the base 630 while electrically interconnecting the first transmission line 622 and the second transmission line 642.

In an embodiment, the second via 632-2 may be disposed or provided in an area adjacent to the end of the FPCB. That is, the second via 632-2 may be closer to the end area 646 than the first via 632-1. The first via 632-1 and the second via 632-2 may be disposed or provided to penetrate the base 630 while electrically interconnecting the first transmission line 622 and the second transmission line 642.

In an embodiment, the FPCB 600 may include a first shield layer 610. The first shield layer 610 may mean an EMI shield layer configured to shield the FPCB 600. As illustrated in FIG. 6B, the first shield layer 610 of the FPCB 600 may extend to the end of the FPCB 600 and may be attached thereto. Conventionally, since an EMI shield layer is not attached to the terminal portion of a connector, there is a problem due to signal noise of a high-speed signal induced at the terminal portion. According to an embodiment of the disclosure, by extending the first shield layer 610 to the end of the FPCB, it is possible to obtain an effect of alleviating signal noise induced in the terminal portion.

In an embodiment, the first conductive layer 620 may include a reinforcing line 624. Referring to FIG. 6B, the reinforcing line 624 may mean a line included in the area indicated by the dotted line indicated at the end of the FPCB. The reinforcing line 624 may be located at an end of the first conductive layer 620. The reinforcing line 624 may be disposed or provided to be spaced apart by a predetermined distance from the first transmission line 622, rather than being electrically connected to the first transmission line 622. The reinforcing line 624 may be a component configured to prevent components to be electrically separated from each other from being electrically connected to each other in the process of disposing the FPCB 600 in an electronic device. For example, since the first shield layer 610 is provided up to the end of the first conductive layer 620, there is a case where the first shield layer 610 and the second conductive layer 640 are electrically connected to each other. The reinforcing line 624 may be located in the end area of the first conductive layer 620 to prevent the first shield layer 610 from being electrically connected to the first conductive layer 620.

FIG. 6C illustrates the second conductive layer 640 of the FPCB 600 illustrated in FIG. 6A.

In an embodiment, the second conductive layer 640 may include a second transmission line 642 through which an electrical signal flows. The second transmission line 642 may be made of a conductive material.

In an embodiment, the first conductive layer 620 and the second conductive layer 640 may be connected to each other via the first via 632-1 and the second via 632-2. The first via 632-1 and the second via 632-2 may be made of a conductive material. The first via 632-1 and the second via 632-2 may interconnect the first transmission line 622 and the second transmission line 642. The first via 632-1 and the second via 632-2 may be disposed or provided to penetrate the base 630. For example, the first via 632-1 and the second via 632-2 may be disposed or provided to pass through the base 630 while being connected to the first transmission line 622 and the second transmission line 642. The first via 632-1 and the second via 632-2 may be disposed or provided at a predetermined distance from the terminal portion 644.

In an embodiment, the first via 632-1 may be disposed or provided at a predetermined distance from the end of the FPCB in the opposite direction. Referring to FIG. 6B, the first via 632-1 may be disposed or provided at a position spaced apart from the terminal portion 644 by a predetermined distance in the opposite direction in the FPCB 600. The first via 632-1 may be disposed or provided to penetrate the base 630 while electrically interconnecting the first transmission line 622 and the second transmission line 642.

In an embodiment, the second via 632-2 may be disposed or provided in an area adjacent to the end of the FPCB. The first via 632-1 and the second via 632-2 may be disposed or provided to penetrate the base 630 while electrically interconnecting the first transmission line 622 and the second transmission line 642.

In an embodiment, the terminal portion 644 may be disposed or provided on the second conductive layer 640 of the FPCB 600. Referring to FIG. 6C, the terminal portion 644 may mean an area of the FPCB 600 indicated by the solid rectangular line. A connector configured to connect the FPCB to another component may be inserted into the terminal portion 644. The terminal portion 644 may be provided on the second conductive layer 640. The terminal portion 644 may be disposed or provided at an end of the FPCB. The terminal portion 644 may be referred to as a "connecting portion," an "inserting portion," a "pad," or another term.

In an embodiment, the terminal portion 644 may include a first terminal portion 644-1 and a second terminal portion 644-2. The second terminal portion 644-2 may mean a portion where the first transmission line 622 and the second transmission line 642 connected to each other via the second via 632-2 are exposed to the outside. The first terminal portion 644-1 may mean a portion where the first transmission line 622 and the second transmission line 642 connected to each other via the first via 632-1 are exposed to the outside. The first terminal portion 644-1 and the second terminal portion 644-2 may be disposed or provided to be spaced apart by a predetermined distance from each other. The first terminal portion 644-1 and the second terminal portion 644-2 may not be electrically connected to each other.

In an embodiment, a transmission line or pattern may not be disposed in an area 646 adjacent to the end of the FPCB 600. Among the existing FPCBs, in the case of an FPCB including two conductive layers, the terminal portion disposed on the second conductive layer may be disposed up to the end of the FPCB. In the case where the terminal portion is located up to the end of the FPCB, when the first shield layer extends up to the end of the first conductive layer, components to be electrically separated may be electrically connected to each other in the process of disposing the FPCB in an electronic device. For example, a short may occur when the first shield layer comes into contact with the second conductive layer. According to an embodiment of the disclosure, in order to prevent the first shield layer 610 and the second conductive layer 640 from being shorted due to the extension of the first shield layer 610 up to the end of the FPCB, the terminal portion 644 may be disposed to be spaced apart by a predetermined distance from the end. When a transmission line or a via to connected to the terminal portion is disposed at the end of the second conductive layer, it may be deleted or removed.

As described above, a flexible printed circuit board (FPCB) included in an electronic device according to an embodiment of the disclosure may include a base, a first conductive layer located in a first direction of the base, a second conductive layer located in a second direction of the base, a terminal portion located on one side surface of the second conductive layer and exposed to the outside to be electrically connected to an external terminal in the second direction, a first shield layer disposed in the first direction of the first conductive layer and disposed to at least partially overlap the terminal portion, and a second shield layer disposed in the second direction of the second conductive layer and disposed to be spaced apart from the terminal portion so as not to overlap the terminal portion.

According to an embodiment, the terminal portion may be disposed to be spaced apart from the one side surface by a predetermined distance.

According to an embodiment, the FPCB may include at least one first transmission line disposed on the first conductive layer and at least one second transmission line disposed on the second conductive layer.

According to an embodiment, the FPCB may include a reinforcing line disposed on the one side surface of the first conductive layer and not electrically connected to the at least one first transmission line.

According to an embodiment, the FPCB may include at least one via passing through the base and interconnecting the first conductive layer and the second conductive layer.

According to an embodiment, the at least one via may be disposed on the one side surface of the terminal portion or in a direction opposite to the one side surface.

A flexible printed circuit (FPC) according to various embodiments of the disclosure may include a first conductive layer, a base disposed over the first conductive layer, and a second conductive layer disposed over the base. The first conductive layer may have a first area in which a wiring is removed from an edge of the FPC, the second conductive layer may have a wiring disposed up to the edge of the FPC, and a first wiring included in the first conductive layer may be exposed to be electrically connected to a connector in a second area spaced farther apart from the edge than the first area.

In an embodiment, a circuit board (FPC) electrically connected to an electronic device includes an edge of the circuit board (leftmost side surface in FIGS. 4A, 5A and 6A) a base layer (430, 530, 630), a first conductive layer and a second conductive layer facing each other with the base layer therebetween, the first conductive layer (440, 540, 640) including a first wiring (442, 542, 642) defining a first terminal portion (444, 544, 644) exposed outside of the circuit board, spaced apart from the edge of the circuit board and at which the circuit board is connected to the electronic device, and the second conductive layer (420, 520, 620) including a wiring (422 and 424, 522 and 524, 622 and 624) having an end spaced apart from the edge of the circuit board.

In an embodiment, the first conductive layer may further include a second wiring (642) defining a second terminal portion exposed outside of the circuit board, spaced apart from both the edge of the circuit board and the first terminal portion, and at which the circuit board is connected to the electronic device. The first wiring and the second wiring (632-1 and 632-2) of the first conductive layer (640) are electrically insulated from each other.

According to an embodiment, the second conductive layer may include a first portion of a second wiring, and the first portion of the second wiring may be electrically connected to a second portion of the second wiring disposed on the first conductive layer through a conductive via penetrating the base at one point.

According to an embodiment, one end of the second portion may be exposed to be coupled with the connector in the second area.

According to an embodiment, the conductive via may be provided at a point corresponding to a third area located between the first area and the second area, and one end of the second portion of the second wiring may be exposed to be coupled with the connector in the third area.

In an embodiment, the first wiring of the first conductive layer is electrically connected to the wiring of the second conductive layer, by a first conductive via (432, 532, 632) penetrating the base layer. In a direction along the base layer, the first conductive via (532 and 632-2) may be between the edge of the circuit board and the first terminal portion. In a direction along the base layer, the first terminal portion may be between the edge of the circuit board and the first conductive via (432 and 632-1).

According to an embodiment, the second area and the third area may be electrically insulated from each other.

According to an embodiment, the FPC may further include a first shield layer disposed over the second conductive layer. In an embodiment, the first shield layer (e.g., a first electromagnetic shield layer) includes a side surface which is aligned with the edge of the circuit board (e.g., leftmost end of FIGS. 4A, 5A and 6A).

According to an embodiment, the FPC may further include a reinforcing plate disposed over the first shield layer.

According to an embodiment, the second conductive layer may include a wiring pattern extending from a position having a predetermined gap from a position where the conductive via is located to the edge of the FPC.

According to an embodiment, the FPC may be connected to a connector of an electronic device. That is, the electronic device includes a connector, and the circuit board (FPC) is connected to the connector, at the terminal portion (444, 544, 644).

In an embodiment, the wiring (622) of the second conductive layer includes a first wiring pattern and a second wiring pattern (left 622 and right 622 in FIG. 6A) spaced apart from each other in a direction along the base layer, the first wiring pattern (left 622) closer to the edge of the circuit board than the second wiring pattern (right 622). The first conductive layer (640) may further include a second wiring electrically insulated from the first wiring, and the second wiring defines a second terminal portion exposed outside of the circuit board, spaced apart from both the edge of the circuit board and the first terminal portion, and at which the circuit board is connected to the electronic device. The first wiring (644-2) of the first conductive layer (640) is electrically connected to the first wiring pattern (left 622) of the second conductive layer (620), by a first conductive via (632-2) penetrating the base layer, and the second wiring (644-1) of the first conductive layer (640) is electrically connected to the second wiring pattern (right 622) of the second conductive layer, by a second conductive via (632-1) penetrating the base layer.

An electronic device according to various embodiments may include a housing, a printed circuit board disposed within the housing, a connector disposed on the printed circuit board, and a flexible printed circuit (FPC) having one end connected to the connector. The FPC may include a first conductive layer and a base disposed over the first conductive layer, and a second conductive layer disposed over the base. The first conductive layer may have a first area in which a wiring is removed from an edge of the FPC, the second conductive layer may have a wiring disposed up to the edge of the FRC, and a first wiring included in the first conductive layer may be exposed to be electrically coupled with a connector in a second area spaced farther apart from the edge than the first area.

According to an embodiment, the second conductive layer may include a first portion of a second wiring, and the first portion of the second wiring may be electrically connected to a second portion of the second wiring disposed on the first conductive layer through a conductive via penetrating the base at one point.

According to an embodiment, the conductive via may be provided at a point corresponding to a third area located between the first area and the second area, and one end of the second portion of the second wiring may be exposed to be connected with the connector in the third area.

According to an embodiment, the second area and the third area may be electrically insulated from each other.

According to an embodiment, the FPC may further include a first shield layer disposed over the second conductive layer.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

Although specific embodiments have been described in the detailed description of the disclosure, various modifications and changes may be made thereto without departing from the scope of the disclosure. Therefore, the scope of the disclosure should not be defined as being limited to the embodiments, but should be defined by the appended claims and equivalents thereof.

What is claimed is:

1. A circuit board electrically connected to an electronic device, the circuit board comprising:
   a base layer comprising a first surface and a second surface which is opposite to the first surface;
   a first conductive layer on the first surface of the base layer;
   a second conductive layer which is on the second surface of the base layer and electrically connected to the first conductive layer, the second conductive layer comprising:
      a terminal portion which is exposed outside of the circuit board and at which the circuit board is electrically connected to the electronic device, and
      the terminal portion extending along the base layer to define a line portion of the second conductive layer;
   a first electromagnetic shield layer which is on the first surface of the base layer, faces the base layer with the first conductive layer therebetween, and overlaps the terminal portion of the second conductive layer; and
   a second electromagnetic shield layer which is on the second surface of the base layer, faces the base layer with the line portion of the second conductive layer therebetween, and is spaced apart from the terminal portion of the second conductive layer in a direction along the base layer.

2. The circuit board of claim 1, wherein in the direction along the base layer:
   the base layer comprises a side surface which is furthest from the second electromagnetic shield layer, and
   the terminal portion is spaced apart from the side surface.

3. The circuit board of claim 1, wherein:
   the first conductive layer includes a first transmission line through which an electrical signal flows in the circuit board; and
   the second conductive layer includes a second transmission line through which an electrical signal flows in the circuit board.

4. The circuit board of claim 3, further comprising a reinforcing line defined by the first conductive layer, the reinforcing line being electrically disconnected from the first transmission line.

5. The circuit board of claim 1, further comprising a conductive via passing through the base layer,
   wherein the first conductive layer and the second conductive layer are electrically connected to each other by the conductive via.

6. The circuit board of claim 5, wherein in the direction along the base layer:
   the base layer comprises a side surface which is furthest from the second electromagnetic shield layer, and
   the conductive via is closer to the side surface than the terminal portion of the second conductive layer.

7. The circuit board of claim 5, wherein in the direction along the base layer:
   the base layer comprises a side surface which is furthest from the second electromagnetic shield layer, and
   the conductive via is further from the side surface than the terminal portion of the second conductive layer.

8. The circuit board of claim 1, wherein the circuit board is a flexible circuit board or a flexible printed circuit board.

9. A circuit board electrically connected to an electronic device, the circuit board comprising:

an edge of the circuit board;

a base layer;

a first conductive layer and a second conductive layer facing each other with the base layer therebetween;

the first conductive layer comprising a first wiring defining a first terminal portion exposed outside of the circuit board, spaced apart from the edge of the circuit board and at which the circuit board is connected to the electronic device;

the second conductive layer comprising a wiring having an end spaced apart from the edge of the circuit board; and a first conductive via which passes through the base layer, electrically connects the first conductive layer and the second conductive layer to each other and is non-overlapping the terminal portion along a thickness direction of the circuit board.

10. The circuit board of claim 9, wherein in a direction along the base layer, the first conductive via is between the edge of the circuit board and the first terminal portion.

11. The circuit board of claim 9, wherein in a direction along the base layer, the first terminal portion is between the edge of the circuit board and the first conductive via.

12. The circuit board of claim 11, wherein the first conductive layer further comprises a second wiring defining a second terminal portion exposed outside of the circuit board, spaced apart from both the edge of the circuit board and the first terminal portion, and at which the circuit board is connected to the electronic device.

13. The circuit board of claim 12, wherein the first wiring and the second wiring of the first conductive layer are electrically insulated from each other.

14. The circuit board of claim 9, further comprising a first electromagnetic shield layer on the second conductive layer, wherein the first electromagnetic shield layer includes a side surface which is aligned with the edge of the circuit board.

15. The circuit board of claim 14, further comprising a reinforcing plate on the first electromagnetic shield layer.

16. The circuit board of claim 9, wherein the wiring of the second conductive layer comprises a first wiring pattern and a second wiring pattern spaced apart from each other in a direction along the base layer, the first wiring pattern closer to the edge of the circuit board than the second wiring pattern.

17. The circuit board of claim 16, wherein the first conductive layer further comprises a second wiring electrically insulated from the first wiring, and the second wiring defines a second terminal portion exposed outside of the circuit board, spaced apart from both the edge of the circuit board and the first terminal portion, and at which the circuit board is connected to the electronic device.

18. The circuit board of claim 17, wherein the first wiring of the first conductive layer is electrically connected to the first wiring pattern of the second conductive layer, by a first conductive via penetrating the base layer, and the second wiring of the first conductive layer is electrically connected to the second wiring pattern of the second conductive layer, by a second conductive via penetrating the base layer.

19. The circuit board of claim 9, wherein the electronic device includes a connector, and the circuit board is connected to the connector, at the first terminal portion.

* * * * *